United States Patent
Goto

(10) Patent No.: US 10,403,530 B2
(45) Date of Patent: Sep. 3, 2019

(54) SUBSTRATE CONVEYING ROBOT AND SUBSTRATE PROCESSING SYSTEM

(71) Applicant: KAWASAKI JUKOGYO KABUSHIKI KAISHA, Kobe-shi, Hyogo (JP)

(72) Inventor: Hirohiko Goto, Akashi (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 15/555,585

(22) PCT Filed: Mar. 3, 2016

(86) PCT No.: PCT/JP2016/056636
§ 371 (c)(1),
(2) Date: Sep. 5, 2017

(87) PCT Pub. No.: WO2016/140318
PCT Pub. Date: Sep. 9, 2016

(65) Prior Publication Data
US 2018/0053672 A1 Feb. 22, 2018

(30) Foreign Application Priority Data

Mar. 3, 2015 (JP) .................... 2015-041616

(51) Int. Cl.
*B25J 9/04* (2006.01)
*H01L 21/687* (2006.01)
(Continued)

(52) U.S. Cl.
CPC ........ *H01L 21/67742* (2013.01); *B25J 9/042* (2013.01); *B25J 11/0095* (2013.01);
(Continued)

(58) Field of Classification Search
CPC ................................. B25J 9/042; B25J 9/043
See application file for complete search history.

(56) References Cited

U.S. PATENT DOCUMENTS 7,699,021 B2 * 4/2010 Volfovski ............... G03B 27/32
118/50
2010/0290886 A1 * 11/2010 Hashimoto ............ B25J 9/042
414/800

FOREIGN PATENT DOCUMENTS

JP 07050334 A * 2/1995
JP 07297255 A * 11/1995
(Continued)

*Primary Examiner* — Gerald McClain
(74) *Attorney, Agent, or Firm* — Oliff PLC

(57) ABSTRACT

A control device is configured to make a robot arm and a substrate holding device execute a blade member advancing operation for advancing a pair of blade members into a substrate placing structure, a substrate receiving operation for receiving a substrate placed on an upper stage of the substrate placing structure by the blade member in a substrate non-holding state, and a substrate placing operation for placing the substrate on the blade member in a substrate holding state onto a lower stage. A timing of receiving a substrate by the substrate receiving operation is shifted from a timing of placing a substrate by the substrate placing operation. A substrate conveying robot capable of shortening the tact time upon conveying substrates regardless of the kind of substrate fixing method in the substrate holding device can be provided.

16 Claims, 34 Drawing Sheets

(51) Int. Cl.
*H01L 21/677* (2006.01)
*B25J 11/00* (2006.01)
*B25J 18/04* (2006.01)
*B25J 15/00* (2006.01)

(52) U.S. Cl.
CPC ........... *B25J 15/0052* (2013.01); *B25J 18/04* (2013.01); *H01L 21/67706* (2013.01); *H01L 21/67766* (2013.01); *H01L 21/67778* (2013.01); *H01L 21/67781* (2013.01); *H01L 21/687* (2013.01); *H01L 21/68707* (2013.01); *H01L 21/68742* (2013.01)

(56) References Cited

FOREIGN PATENT DOCUMENTS

| | | |
|---|---|---|
| JP | H07-297255 A | 11/1995 |
| JP | 2004-311821 A | 11/2004 |
| WO | 2010/103876 A1 | 9/2010 |

* cited by examiner

SUBSTRATE CONVEYING ROBOT AND SUBSTRATE PROCESSING SYSTEM

TECHNICAL FIELD

The present invention relates to a substrate conveying robot having a robot arm to which a substrate holding device is mounted and to a substrate processing system provided with the substrate conveying robot.

BACKGROUND ART

Conventionally, a technology of conveying substrates such as wafers for manufacturing semiconductors by a robot is used broadly. Here, various processing steps such as a wafer cleaning process, a film-forming process, a heating process, and an etching process are executed when manufacturing semiconductors. The respective processing steps are executed by different processing devices respectively, and therefore wafers need to be conveyed among a plurality of processing devices.

A robot is used for the above-mentioned wafer conveyance and high cleanliness is required for the surrounding atmosphere in the semiconductor manufacturing process. Therefore, the benefit of an unmanned operation by using a robot is great.

Additionally, in order to improve throughput of the semiconductor manufacturing, tact time upon conveying wafers is required to be shortened. There is a robot conveying a plurality of wafers at the same time by one hand mounted on a robot arm as a technology for shortening the tact time upon conveying wafers. This kind of robot, for example, holds and takes a plurality of wafers at the same time by one hand from a lot of wafers stored in a FOUP and conveys them to a wafer placing shelf on a processing device side at the same time (Patent Document 1).

Note that, in various processing steps upon manufacturing semiconductors, there are a step of processing a plurality of wafers at the same time (batch processing step) and a step of processing wafers one by one (single-wafer processing step). When conveying wafers in relation to the batch processing step, the above-mentioned robot which conveys a plurality of wafers at the same time is suitable.

In contrast, when conveying wafers in relation to the single-wafer processing step, the processing step is executed for each wafer. Therefore, it may be advantageous to convey processed wafers and un-processed wafers one by one respectively. In this case, the above-mentioned robot which conveys a plurality of wafers at the same time is not suitable.

In Patent Document 2, a substrate holding device including a pair of hands (U-shaped blade members) capable of changing their interval in the vertical direction is described as a technology for carrying-out one processed substrate and carrying-in one unprocessed substrate at the same time. In this substrate holding device, by widening a vertical interval between hands when the lower hand is in a wafer holding state and the upper hand is in a wafer non-holding state, a wafer held by the lower hand can be placed onto an empty lower stage of a shelf and the empty upper hand can receive a wafer placed on an upper stage of the shelf at the same time.

RELATED ART DOCUMENTS

Patent Documents

[Patent Document 1] Japanese Patent Application Laid-Open No. 2004-311821

[Patent Document 2] Japanese Patent Application Laid-Open No. H07-297255

SUMMARY OF INVENTION

Objects to be Achieved by the Invention

Here, one of fixing mechanisms for fixing and holding a wafer on a hand is an edge grip type fixing mechanism. This edge grip type fixing mechanism has, for example, a fixed gripping portion provided on a blade member configuring a hand and a movable gripping portion for pressing a wafer so as to grip the wafer together with the fixed gripping portion.

For receiving a wafer using a hand having the edge grip type fixing mechanism, the blade member is advanced below a wafer placed on the shelf. At this time, the blade member is to be advanced until the fixed gripping portion of the blade member slightly exceeds the portion of an edge portion on a distal side of the wafer.

If the fixed gripping portion of the blade member is tried to be exactly fitted to the position of the edge portion on the distal side of the wafer, the fixed gripping portion is possibly positioned in front of the position of the edge portion on the distal side of the wafer due to deflection of the robot arm, error of teaching, or the like.

When the blade member is elevated for receiving the wafer in the state that the fixed gripping portion of the blade member is positioned in front of the position of the edge portion on the distal side of the wafer as above, the wafer runs onto a protruded portion for forming the fixed gripping portion. Therefore the wafer cannot be received.

In this regard, the conventional art in Patent Document 2 is to perform a substrate placing operation for placing a wafer held by the lower hand onto the lower stage and a substrate receiving operation for receiving a wafer on the upper stage by the empty upper hand at the same time.

If the edge grip type hand is applied to the art in Patent Document 2, the problems is that, when the upper hand is positioned to a position suitable for the substrate receiving operation upon hand advancing to the shelf, the lower hand deviates from the position suitable for the substrate placing operation to the distal side. On the other hand, when the lower hand is positioned to the position suitable for the substrate placing operation, the upper hand deviates from the position suitable for the substrate receiving operation to the proximal side.

As above, according to the conventional art, tact time upon conveying substrates cannot be shortened in a substrate conveying robot comprising a substrate holding device for holding a substrate with the edge grip system.

The present invention is made considering the above-mentioned problems of the conventional art and its object is to provide a substrate conveying robot capable of shortening the tact time upon conveying substrates regardless of kind of substrate fixing system of a substrate holding device mounted on a robot arm and a substrate conveying system comprising the robot.

Means for Achieving the Object

In order to achieve the above-stated object, a first aspect of the present invention is a substrate conveying robot for holding and conveying a substrate, comprising: a robot arm; a substrate holding device mounted on the robot arm; and a control device for controlling the robot arm and the substrate holding device, wherein the substrate holding device has a pair of blade members which are arranged in a vertical direction and each of which can hold the substrate, a fixed gripping portion which is provided to each of the pair of blade members and abutted on an edge portion of the substrate, a movable gripping portion for gripping the substrate together with the fixed gripping portion by pressing the substrate, and a blade elevating unit for moving one of the pair of blade members relative to the other one of the pair of blade members in a vertical direction, wherein the control device is configured to make the robot arm and the substrate holding device execute, on the premise that the one of the pair of blade members is in a substrate holding state and the other one of the pair of blade members is in a substrate non-holding state, a blade member advancing operation for advancing the pair of blade members into a substrate placing structure having an upper stage and a lower stage, a substrate receiving operation for receiving the substrate placed on one of the upper stage and the lower stage by the blade member in the substrate non-holding state, and a substrate placing operation for placing the substrate on the blade member in the substrate holding state onto the other one of the upper stage and the lower stage, and wherein a timing of receiving the substrate by the substrate receiving operation is shifted from a timing of placing the substrate by the substrate placing operation.

A second aspect of the present invention is that, in the first aspect, the control device is configured to control the robot arm and the substrate holding device so that, in the substrate receiving operation, the blade member is advanced until the fixed gripping portion of the blade member exceeds a position of an edge portion on a distal side of the substrate placed on the substrate placing structure, and after that, the blade member in the substrate non-holding state is elevated so as to receive the substrate by the blade member.

A third aspect of the present invention is that, in the first or second aspect, a pair of the movable gripping portions can be driven independently from each other.

A fourth aspect of the present invention is that, in any one of the first to third aspects, the substrate conveying robot further comprises a Z-axis elevating unit having a servo motor capable of elevating the pair of blade members simultaneously, wherein the substrate receiving operation is executed using the Z-axis elevating unit.

A fifth aspect of the present invention is that, in any one of the first to fourth aspects, the substrate receiving operation is executed by an upper blade member of the pair of blade members.

A sixth aspect of the present invention is that, in any one of the first to fifth aspects, the substrate holding device is configured to be switchable between a first working state that the pair of the blade members are arrange in a vertical direction and a second working state that the pair of blade members are arranged in positions deviating from a vertical direction and the single blade member can advance into the substrate placing structure.

A seventh aspect of the present invention is that, in any one of the first to sixth aspects, the control device is configured to elevate the lower blade member by the blade elevating unit prior to the substrate receiving operation and the substrate placing operation on the premise that both the pair of blade members are in the substrate non-holding state so as to make the robot arm and the substrate holding device execute a lowermost stage substrate receiving operation for receiving the substrate placed on a lowermost stage of the substrate placing structure.

An eighth aspect of the present invention is that, in any one of the first to seventh aspects, both the pair of blade members are driven to be elevated by the blade elevating unit.

A ninth aspect of the present invention is that, in the eighth aspect, the blade elevating unit can drive each of the pair of blade members to be elevated independently.

A tenth aspect of the present invention is that, in the eighth or ninth aspect, the blade elevating unit has a pair of fluid pressure cylinders for driving each of the pair of blade members to be elevated, wherein the fluid pressure cylinder for the upper blade member is arranged such that its piston faces downward, and wherein the fluid pressure cylinder for the lower blade member is arranged such that its piston faces upward.

An eleventh aspect of the present invention is that, in any one of the first to seventh aspects, only one of the pair of blade members is driven to be elevated by the blade elevating unit.

A twelfth aspect of the present invention is that, in the eleventh aspect, the blade elevating unit has a fluid pressure cylinder for driving one of the pair of blade members to be elevated, wherein the other one of the pair of blade members is positioned in the opposite side of a side where a piston of the fluid pressure cylinder is positioned.

A thirteenth aspect of the present invention further comprises, in the eleventh or twelfth aspect, a substrate detection unit having a substrate sensor provided on a distal end portion of the blade member which is not driven to be elevated by the blade elevating unit.

A fourteenth aspect of the present invention further comprises, in any one of the first to thirteenth aspects, a substrate detection unit having a substrate sensor provided on a distal end portion of the blade member which is driven to be elevated by the blade elevating unit.

A fifteenth aspect of the present invention is that, in any one of the first to fourteenth aspects, the substrate holding device has a pair of hands arranged in a vertical direction, each of the pair of hands having the blade member, wherein each of the pair of hands has a plurality of the blade members whose vertical interval is fixed mutually.

A sixteenth aspect of the present invention is a substrate processing system, comprising: the substrate conveying robot according to any one of the first to fifteenth aspects; and a plurality of different kinds of the substrate placing structures, wherein a substrate placing pitch in a plurality of the substrate placing structures is the same.

Note that the above-mentioned substrate placing structure includes various structures in which at least two substrates can be placed in the vertical direction. For example, a substrate storing container such as FOUP, a substrate placing shelf (wafer board) as a processing device port, a buffer-type aligner, and the like are included. Here, the buffer-type aligner refers to an aligner comprising a substrate elevating mechanism for making the next substrate stand by above a rotational mechanism for substrate.

Advantageous Effect of the Invention

The present invention can provide a substrate conveying robot capable of shortening the tact time upon conveying substrates regardless of the kind of substrate fixing method in a substrate holding device mounted on a robot arm, and a substrate conveying system provided with the robot.

EMBODIMENT OF THE INVENTION

Hereunder, a substrate conveying robot according to an embodiment of the present invention will be described referring to the figures. Note that the substrate conveying robot according to the embodiment is particularly suitable for conveying a wafer (circular substrate) for manufacturing semiconductors.

Figure 1:
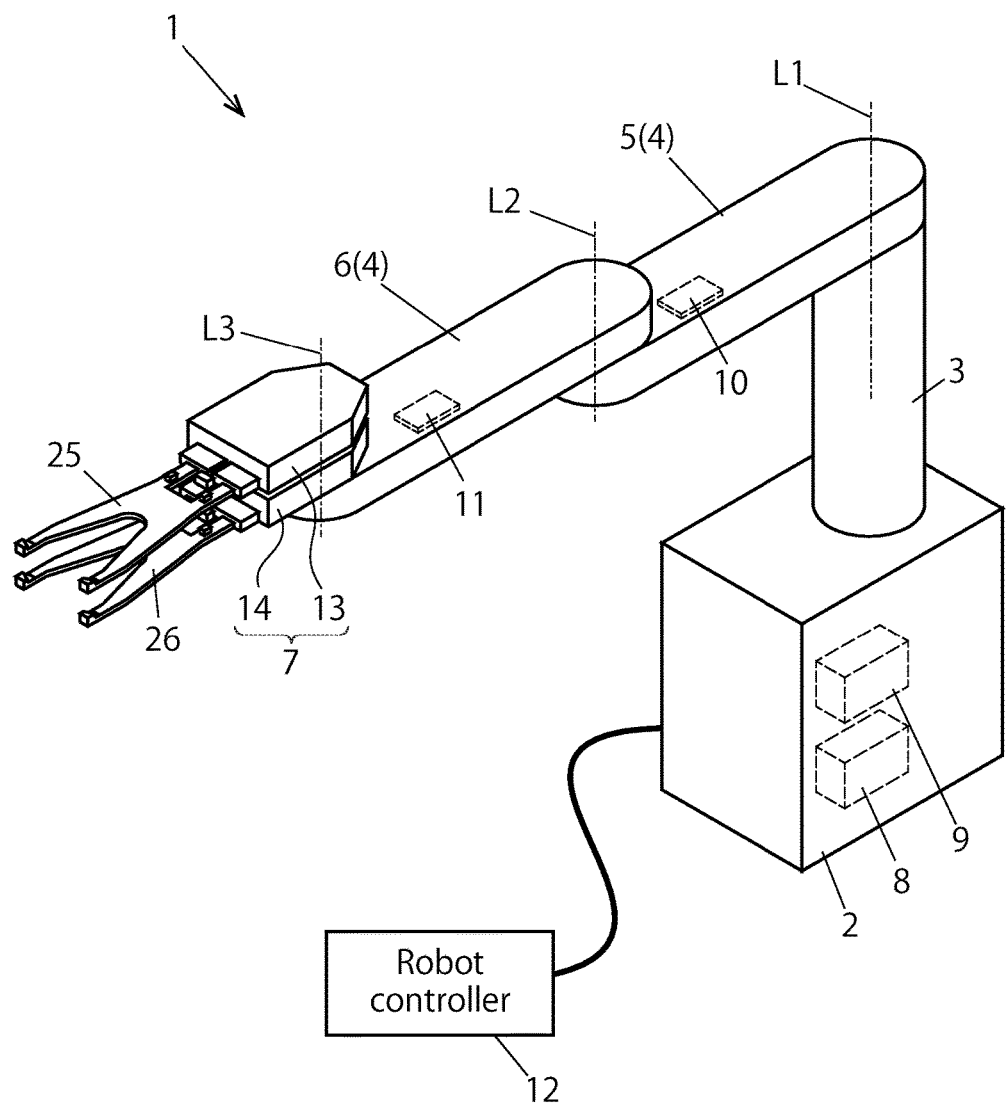
FIG. 1 is a perspective view schematically illustrating a substrate conveying robot according to an embodiment of the present invention.

As illustrated in FIG. 1, a substrate conveying robot 1 according to the embodiment has a base 2. A rotary main shaft 3 is provided on the base 2 so as to elevate along a first rotational axis L1.

The base end of a robot arm 4 is connected on the upper end of the rotary main shaft 3. The robot arm 4 has a first link member 5 having the first rotational axis L1 on the base end thereof and also having a second rotational axis L2 on the distal end thereof, and a second link member 6 having the second rotational axis L2 on the base end thereof and also having a third rotational axis L3 on the distal end thereof. A substrate holding device 7 is provided on the distal end of the second link member 6 so as to rotate about the third rotational axis L3.

The elevating operation and the rotating operation of the rotary main shaft 3 are performed by a Z-axis elevating drive source 8 and a turning drive source 9 provided inside the base 2 respectively. The rotary main shaft 3 rotates about the first rotational axis L1 so that the first link member 5 rotates about the first rotational axis L1 integrally with the rotary main shaft 3.

The rotational operation of the second link member 6 with respect to the first link member 5 is performed by a drive source 10 provided inside the first link member 5. The rotating operation of the substrate holding device 7 with respect to the second link member 6 is performed by a drive source 11 provided inside the second link member 6.

The above-stated Z-axis elevating drive source 8 configures a Z-axis elevating unit in the present invention, and the substrate holding device 7 can be elevated by elevating the robot arm 4 by the Z-axis elevating drive source. The drive sources 8, 9, 10, 11 can be configured by servo motors, for example.

Each drive source 8, 9, 10, 11 is controlled by a robot controller (control device) 12. Thereby, the elevating operation and the rotating operation of the robot arm 4 having the substrate holding device 7 are controlled.

Note that a configuration of a robot arm of the substrate conveying robot according to the present invention and its drive unit is not limited to the above-mentioned configuration illustrated in FIG. 1, and any configuration capable of positioning a substrate holding device to a substrate to be conveyed can be employed.

Figure 2:
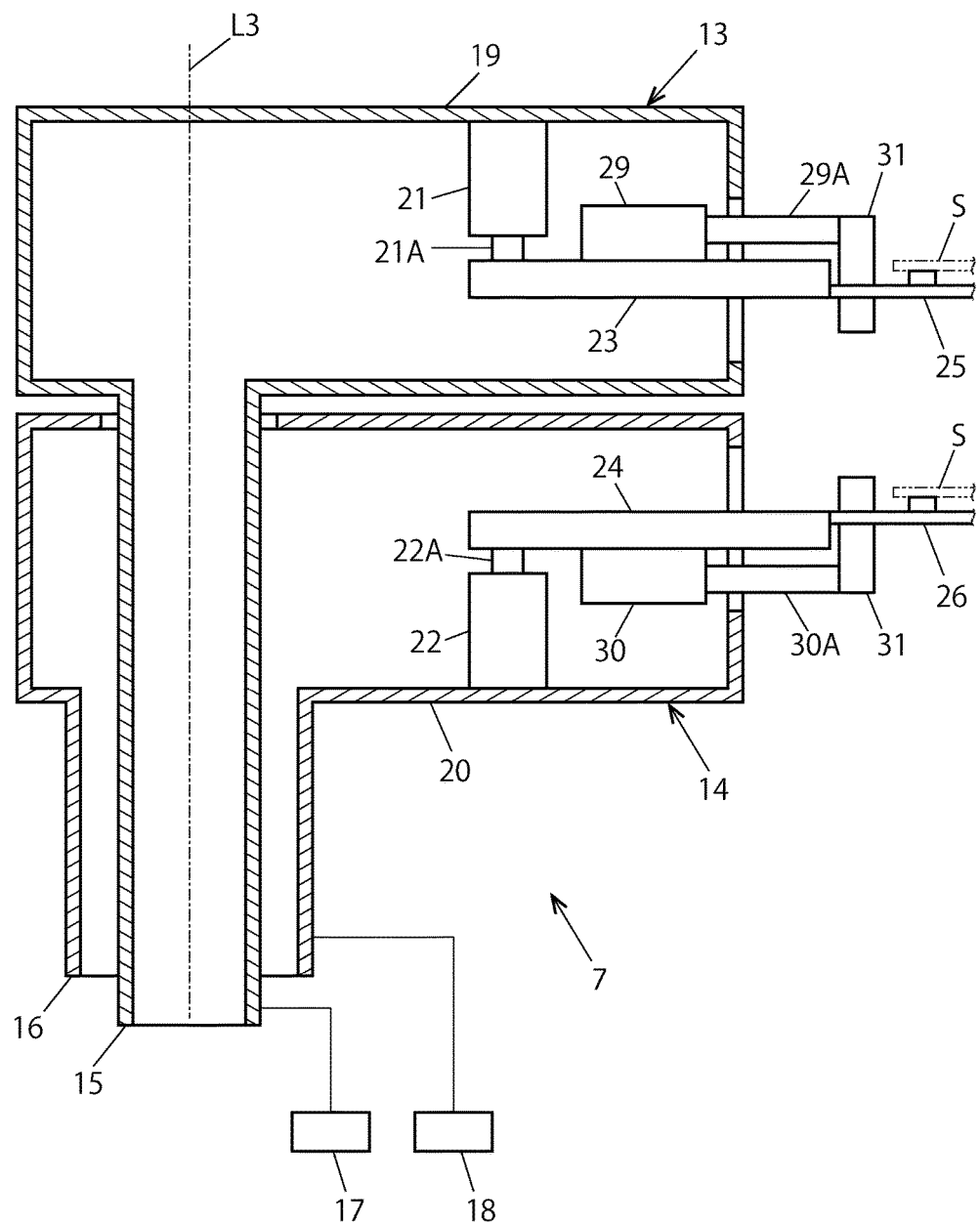
FIG. 2 is a schematic sectional view of the internal structure of a hand of the substrate conveying robot in FIG. 1, illustrating the state that a vertical interval of upper and lower blade members is made maximum.
Figure 3:
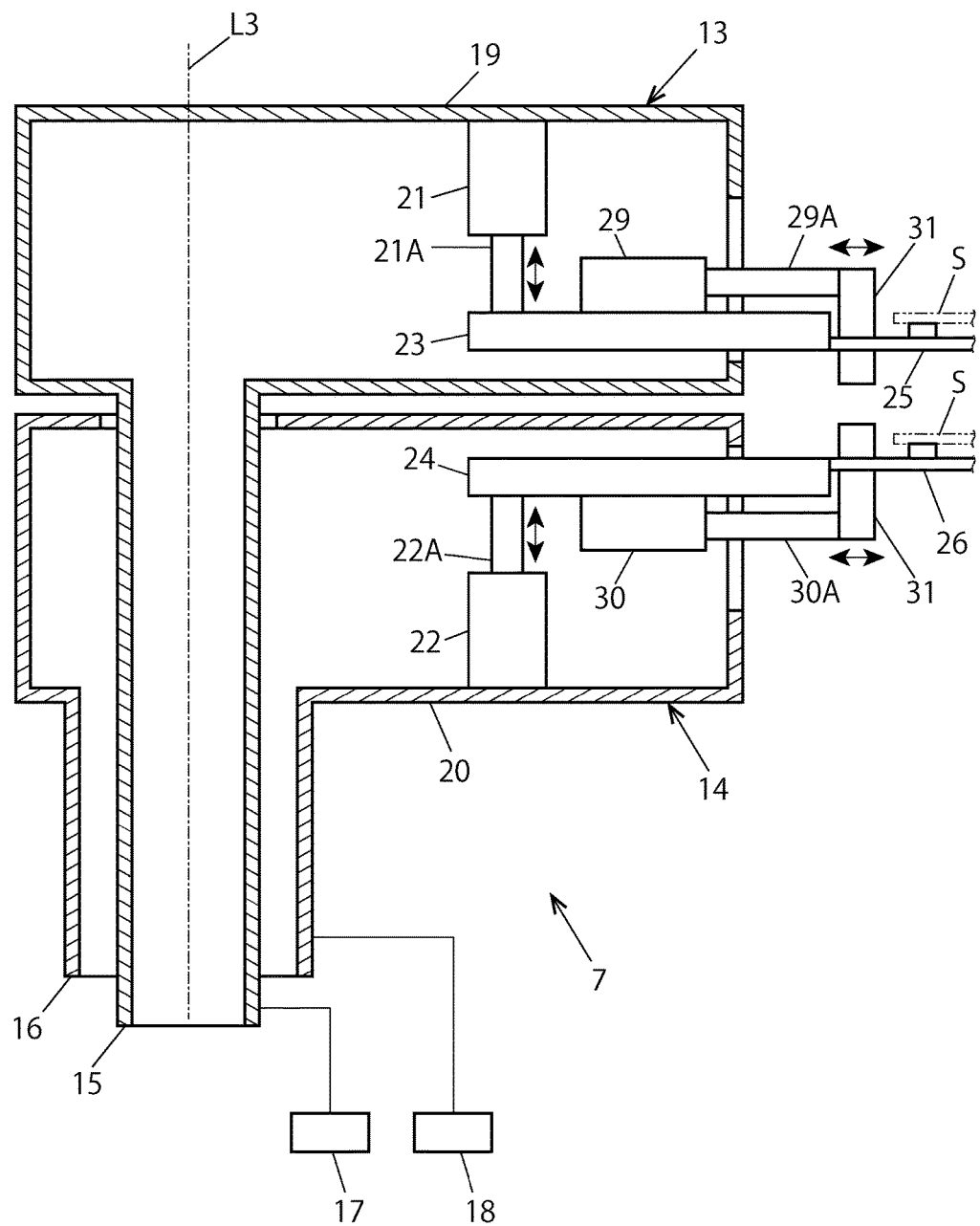
FIG. 3 is a schematic sectional view of the internal structure of a hand of the substrate conveying robot in FIG. 1, illustrating the state that a vertical interval of upper and lower blade members is made minimum.

As illustrated in FIG. 2 and FIG. 3, the substrate holding device 7 mounted on the distal end of the robot arm 4 has an upper hand 13 and a lower hand 14 arranged in the vertical direction having the third rotational axis L3 as a common rotational axis. The upper hand 13 has an inner wrist shaft 15 extending along the third rotational axis L3 and the lower hand 14 has an outer wrist shaft 16 extending along the third rotational axis L3 outside the inner wrist shaft 15. The upper hand 13 and the lower hand 14 have wrist shaft drive sources 17, 18 respectively and can rotate about the third rotational axis L3 independently from each other. The wrist shaft drive sources 17, 18 can be configured by servo motors.

The upper hand 13 has an upper hand base portion 19 consisting of a hollow member connected to the upper end of the inner wrist shaft 15 and the lower hand 14 has a lower hand base portion 20 consisting of a hollow member connected to the upper end of the outer wrist shaft 16. An upper elevating air cylinder 21 is provided inside the upper hand base portion 19 with its piston 21A facing downward, and a lower elevating air cylinder 22 is provided inside the lower hand base portion 20 with its piston 22A facing downward.

An upper elevating member 23 is connected to the distal end of the piston 21A of the upper elevating air cylinder 21, and a lower elevating member 24 is connected to the distal end of the piston 22A of the lower elevating air cylinder 22. The base end portion of an upper blade member 25 holding a substrate S is connected to the upper elevating member 23, and the base end portion of a lower blade member 26 holding the substrate S is connected to the lower elevating member 24. The upper elevating air cylinder 21, the lower elevating air cylinder 22, the upper elevating member 23, and the lower elevating member 24 configure a blade elevating unit in the present invention.

The upper elevating air cylinder 21 and the lower elevating air cylinder 22 can be driven independently from each other by the robot controller 12. Therefore, four states can be switched appropriately therebetween with respect to the arrangement of the upper blade member 25 and the lower blade member 26 in the vertical direction. Namely, four states: a first arrangement state (minimum pitch) that the upper blade member 25 is in the lower position and the lower blade member 26 is in the upper position, a second arrangement state (maximum pitch) that the upper blade member 25 is in the upper position and the lower blade member 26 is in the lower position, a third arrangement state (lower middle pitch) that the upper blade member 25 is in the lower position and the lower blade member 26 is in the lower position, and a fourth arrangement state (upper middle pitch) that the upper blade member 25 is in the upper position and the lower blade member 26 is in the upper position can be switched appropriately therebetween.

Since the piston 21A of the upper elevating air cylinder 21 faces downward and the piston 22A of the lower elevating air cylinder 22 faces upward as stated above, the minimum interval (minimum pitch) between the upper blade member 25 and the lower blade member 26 in the vertical direction can be small as illustrated in FIG. 3.

Figure 4:
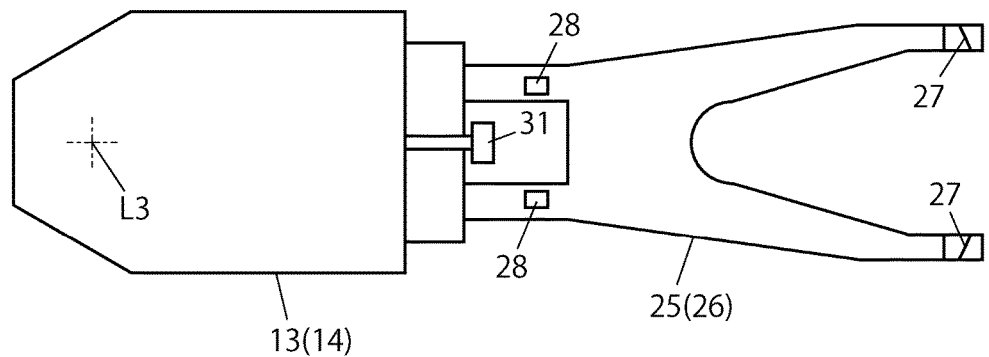
FIG. 4 is an enlarged schematic plan view illustrating an upper hand of the substrate conveying robot in FIG. 1.
Figure 5:
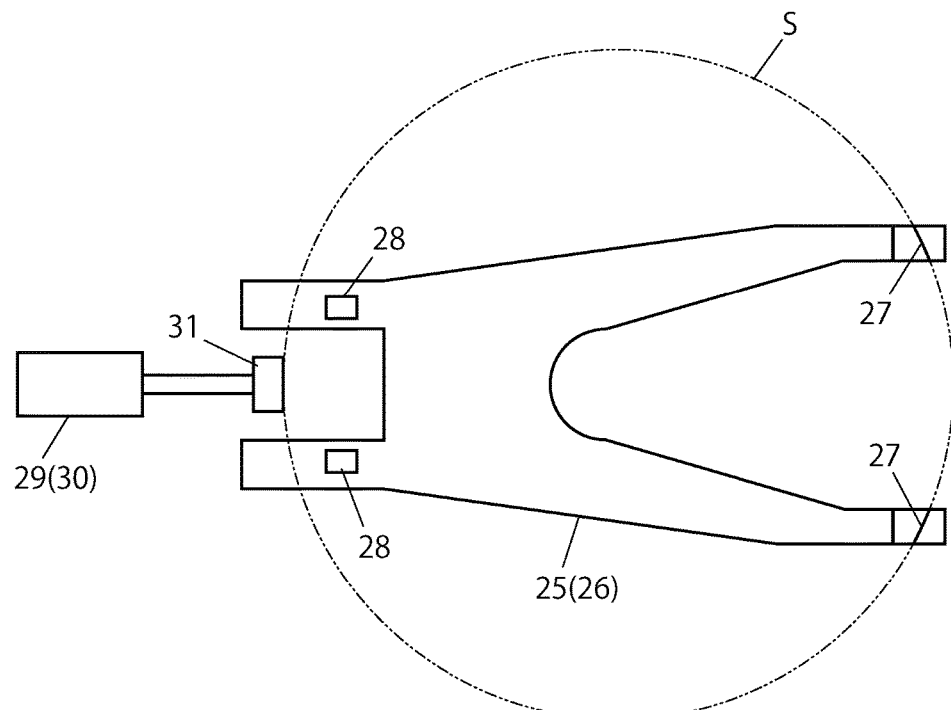
FIG. 5 is a schematic plan view illustrating the state that a substrate is held by a substrate holding device of the substrate conveying robot in FIG. 1.

As illustrated in FIG. 4 and FIG. 5, a pair of fixed gripping portions 27 abutted on edge portions of the substrate S are provided to the respective distal end portions of the upper blade member 25 and the lower blade member 26. A pair of bottom surface supporting portions 28 supporting the bottom surface of the substrate S are provided on the upper surface of the respective base end portions of the upper blade member 25 and the lower blade member 26.

As illustrated in FIG. 2 and FIG. 3, an upper pressing air cylinder 29 is provided on the upper surface of the upper elevating member 23 with its piston 29A facing forward, and a lower pressing air cylinder 30 is provided on the lower surface of the lower elevating member 24 with its piston 30A facing forward.

A movable gripping portion 31 for pressing the substrate S so as to grip the substrate S together with the fixed gripping portion 27 is provided to the distal end of the piston 29A of the upper pressing air cylinder 29. Similarly, the movable gripping portion 31 for pressing the substrate S so as to grip the substrate S together with the fixed gripping portion 27 is provided to the distal end of the piston 30A of the lower pressing air cylinder 29.

The upper pressing air cylinder 29 and the lower pressing air cylinder 30 can be driven independently from each other by the robot controller 12. Accordingly, the movable gripping portion 31 of the upper hand 13 and the movable gripping portion 31 of the lower hand 14 can be driven independently from each other.

Also, the upper pressing air cylinder 29 and the lower pressing air cylinder 30 are provided to the upper elevating member 23 and the lower elevating member 24 respectively, and also the upper blade member 25 and the lower blade member 26 are provided to the upper elevating member 23 and the lower elevating member 24 respectively. Therefore, each movable gripping portion 31 is elevated interlockingly with the elevating operation of each blade member 25, 26.

The substrate holding device 7 is configured so as to be switched between a first working state that the upper blade member 25 and the lower blade member 26 are arranged in the vertical direction and a second working state that the upper blade member 25 and the lower blade member 26 are arranged in a position displaced from the vertical direction and only one of the upper blade member 25 and the lower blade member 26 can be advanced into the substrate placing structure such as the FOUP.

Figure 6:
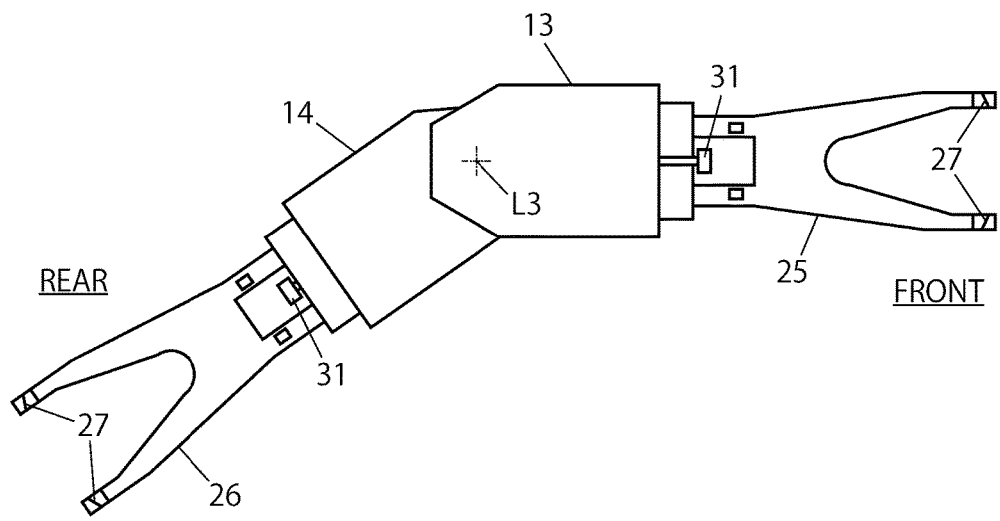
FIG. 6 is a schematic plan view illustrating that a substrate holding device of the substrate conveying robot illustrated in FIG. 1 is in a second working state, illustrating the state that the upper hand faces the advancing direction.
Figure 7:
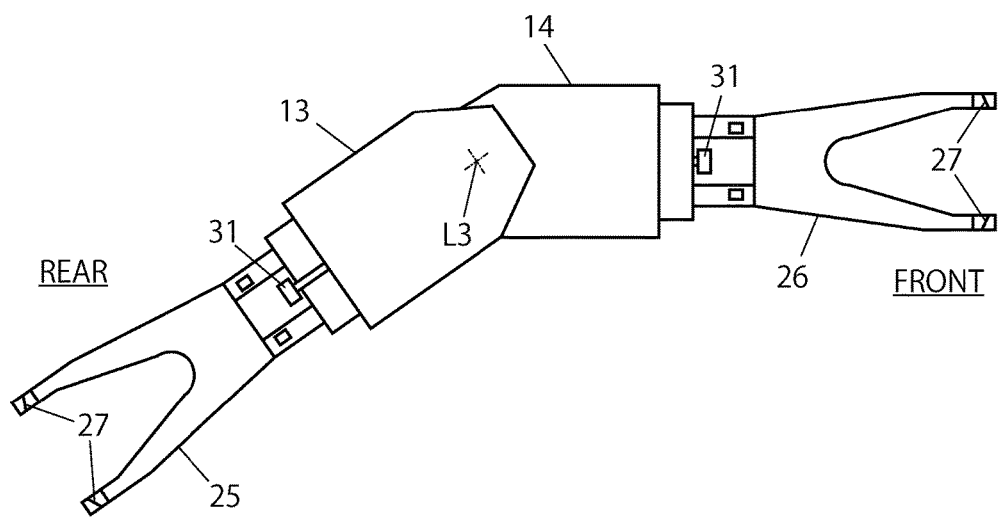
FIG. 7 is a schematic plan view illustrating that a substrate holding device of the substrate conveying robot illustrated in FIG. 1 is in a second working state, illustrating the state that the lower hand faces the advancing direction.

In the second working state, the lower hand 14 can be retreated to a non-working position keeping the upper hand 13 in the working position as illustrated in FIG. 6, or the upper hand 13 can be retreated to the non-working position keeping the lower hand 14 in the working position as illustrated in FIG. 7. Here, "working position" refers to a position where a hand can be advanced into the substrate placing structure such as the FOUP, and "non-working position" refers to a position where the other hand is retreated so as not to interrupt the substrate conveying operation by one hand in the working position.

Figure 8:
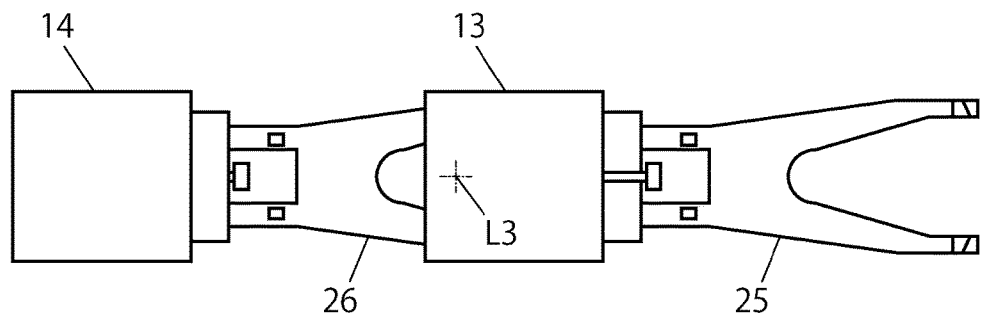
FIG. 8 is a schematic plan view illustrating that a substrate holding device as a modified example of the substrate conveying robot illustrated in FIG. 1 is in a second working state, illustrating the state that the upper hand faces the advancing direction.
Figure 9:
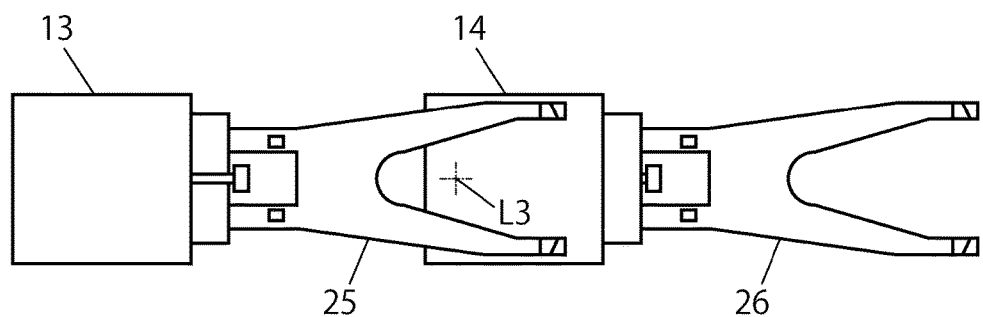
FIG. 9 is a schematic plan view illustrating that a substrate holding device as a modified example of the substrate conveying robot illustrated in FIG. 1 is in a second working state, illustrating the state that the lower hand faces the advancing direction.

Note that, as a modified example, one of the upper hand 13 and the lower hand 14 may be moved to the rear with respect to the other so as to arrange the same in the non-working position, as illustrated in FIG. 8 and FIG. 9.

The position of the third rotational axis L3 of the hand in the working position does not change in both the rotational retreating type illustrated in FIG. 6 and FIG. 7 and the linearly retreating type illustrated in FIG. 8 and FIG. 9, and therefore the effective length of an arm does not change. Therefore, there is an advantage that differences in sagging of the robot arm 4 due to its weight do not arise when switching between the working position/non-working position of the upper hand 13 and the lower hand 14. The differences in sagging of the robot arm 4 due to its weight become a problem particularly in the case of the double-arm type.

Next, the operation when driving the robot arm 4 and the substrate holding device 7 by the above-stated robot controller 12 so as to receive a processed substrate from the upper stage of the substrate placing structure and place an unprocessed substrate on the lower stage of the substrate placing structure will be described referring to FIG. 10A to FIG. 10G.

Note that the substrate placing structure 100 illustrated in FIG. 10A to FIG. 10G is a buffer-type aligner, for example, that the lower stage of the substrate placing structure 100 configures a rotational mechanism of the aligner and the upper stage of the substrate placing structure 100 configures a substrate elevating mechanism where the next substrate is made standby above the rotational mechanism.

Figure 10A:
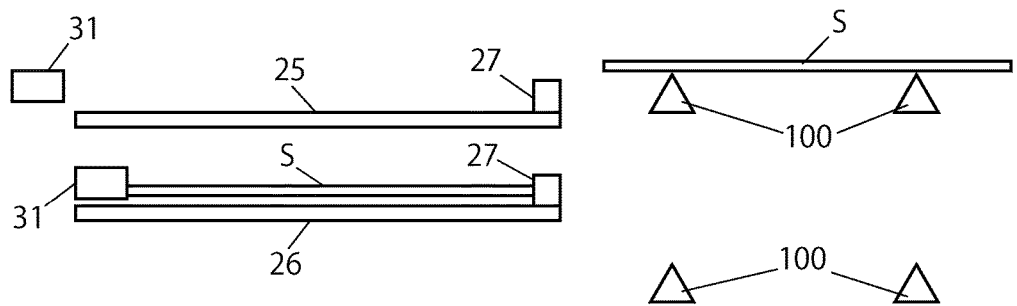
FIG. 10A is schematic view illustrating an operation when receiving a processed substrate and placing an unprocessed substrate using the substrate conveying robot illustrated in FIG. 1.

First, the upper blade 25 is made in the substrate non-holding state and the lower blade member 26 is made in the substrate holding state, as illustrated in FIG. 10A.

Figure 10B:
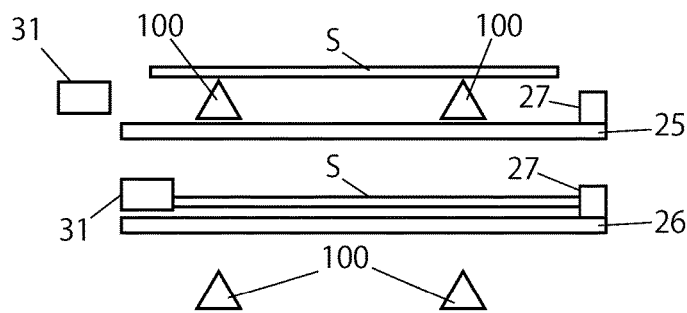
FIG. 10B is another schematic view illustrating an operation when receiving a processed substrate and placing an unprocessed substrate using the substrate conveying robot illustrated in FIG. 1.

Next, the robot arm 4 is driven so as to advance the upper blade member 25 and the lower blade member 26 between the upper stage and the lower stage of the substrate placing structure 100 as illustrated in FIG. 10B (blade member advancing operation). At this time, the upper blade member 25 and the lower blade member 26 are advanced until the fixed gripping portion 27 of the upper blade member 25 exceeds the position of a distal edge portion of the substrate S placed on the upper stage of the substrate placing structure 100.

Figure 10C:
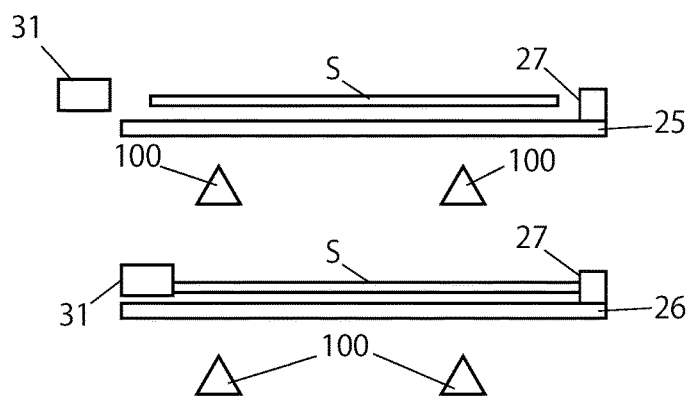
FIG. 10C is another schematic view illustrating an operation when receiving a processed substrate and placing an unprocessed substrate using the substrate conveying robot illustrated in FIG. 1.

Next, the upper elevating air cylinder 21 is driven so as to elevate the upper blade member 25 and receive the substrate S by the upper blade member 25 in the state that the movable gripping portion 31 of the upper hand 13 is retreated to the non-gripping position as illustrated in FIG. 10C (substrate receiving operation). At this time, the fixed gripping portion 27 of the upper blade member 25 is arranged in a position slightly exceeding a distal edge portion of the substrate S placed on the upper stage of the substrate placing structure. Therefore, the substrate S is prevented from getting on a protruding part configuring the fixed gripping portion 27.

Figure 10D:
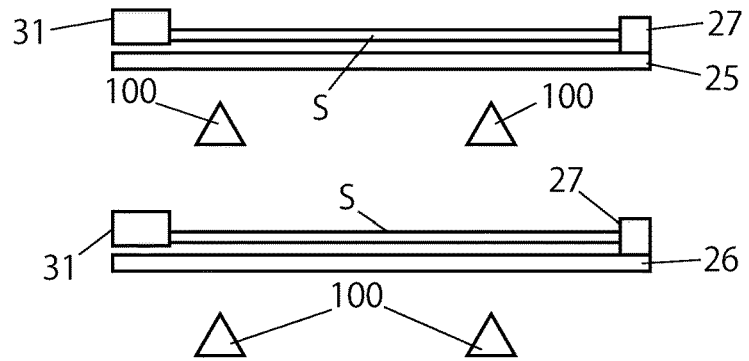
FIG. 10D is another schematic view illustrating an operation when receiving a processed substrate and placing an unprocessed substrate using the substrate conveying robot illustrated in FIG. 1.

Next, the upper pressing air cylinder 29 is driven so as to advance the movable gripping portion 31 of the upper hand 13 and grip and hold the substrate S by the movable gripping portion 31 of the upper hand 13 and the fixed gripping portion 27 as illustrated in FIG. 10D. Thereby, the holding operation of the substrate S by the upper hand 13 is completed.

Then, the robot arm 4 is driven so as to slightly retreat the upper hand 13 and the lower hand 14 at the same time as the above-stated substrate receiving operation or after the substrate receiving operation is completed so that the substrate S held by the lower blade member 26 is arranged above the placing position of the lower stage of the substrate placing structure 100, as illustrated in FIG. 10D.

Figure 10E:
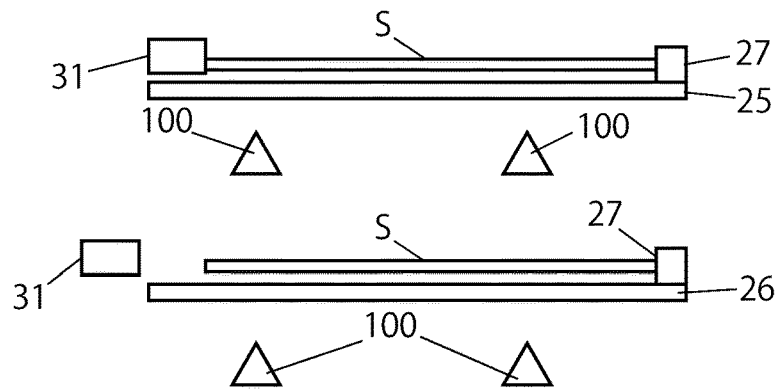
FIG. 10E is another schematic view illustrating an operation when receiving a processed substrate and placing an unprocessed substrate using the substrate conveying robot illustrated in FIG. 1.
Figure 10F:
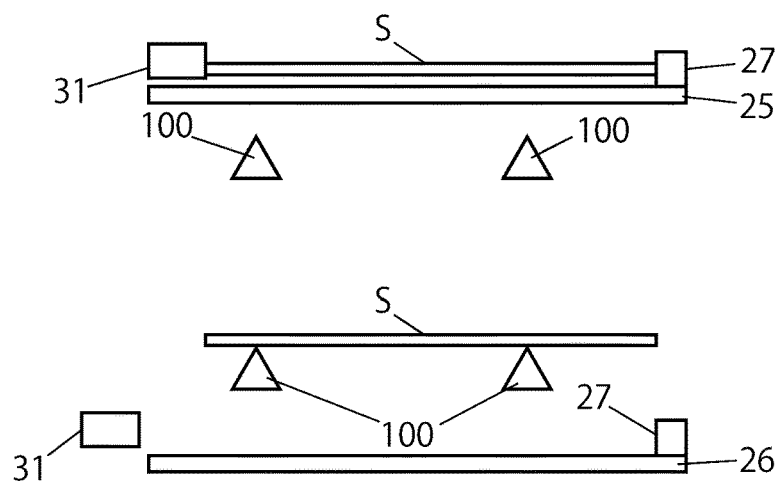
FIG. 10F is another schematic view illustrating an operation when receiving a processed substrate and placing an unprocessed substrate using the substrate conveying robot illustrated in FIG. 1.

Next, the lower pressing air cylinder 30 is driven so as to retreat the movable gripping portion 31 of the lower hand 14 to the non-gripping position, as illustrated in FIG. 10E.

Next, the lower elevating air cylinder 22 is driven so as to lower the lower blade member 26 and place the substrate S on the lower stage of the substrate placing structure 100, as illustrated in FIG. 10E. Thereby, the substrate placing operation by the lower hand 14 is completed.

Figure 10G:
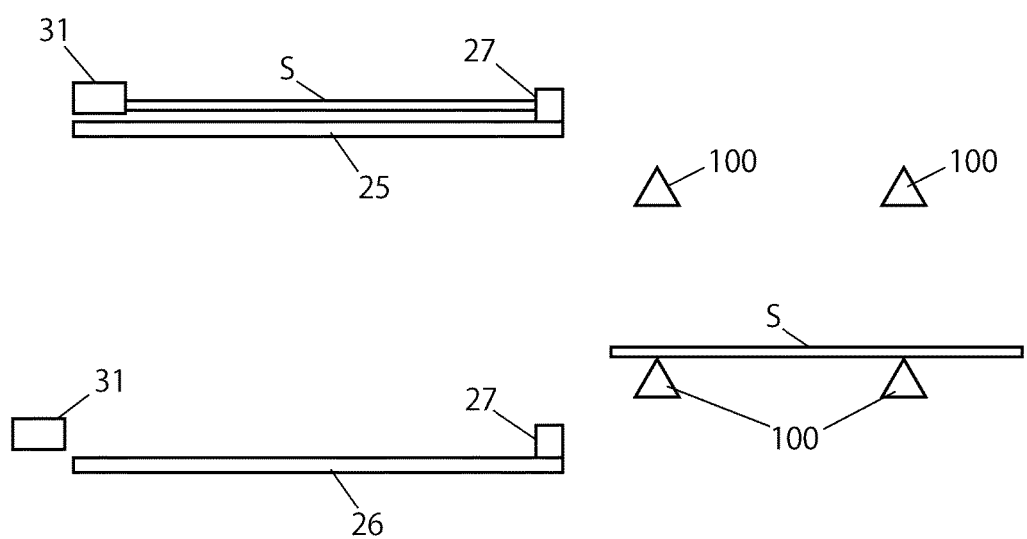
FIG. 10G is another schematic view illustrating an operation when receiving a processed substrate and placing an unprocessed substrate using the substrate conveying robot illustrated in FIG. 1.

Next, the robot arm 4 is driven so as to retreat the upper blade member 25 and the lower blade member 26 and convey the processed substrate S to another substrate placing structure, as illustrated in FIG. 10G.

As described above using the FIG. 10A to FIG. 10G, a timing to receive the processed substrate S by the substrate receiving operation and a timing to place the unprocessed substrate S by the substrate placing operation are deviated from each other when receiving the processed substrate S and placing the unprocessed substrate S using the substrate conveying robot 1 according to according to the embodiment. Thereby, the upper blade member 25 can be arranged in a position slightly overreaching forward (in the distal direction) so that the substrate S does not get on the protrusion part configuring the fixed gripping portion 27 in the substrate receiving operation.

Also, when the processed substrate S is a cleaned substrate, adhesion of particles to the substrate S due to downflow for keeping cleanliness in a semiconductor manufacturing area can be prevented by always holding the processed substrate S by the upper blade member 25.

Next, another operation when driving the robot arm 4 and the substrate holding device 7 by the above-stated robot controller 12 so as to place the unprocessed substrate S on the lower stage of the substrate placing structure 100 and receive the processed substrate S from the upper stage of the substrate placing structure 100 will be described referring to FIG. 11A to FIG. 11H.

Figure 11A:
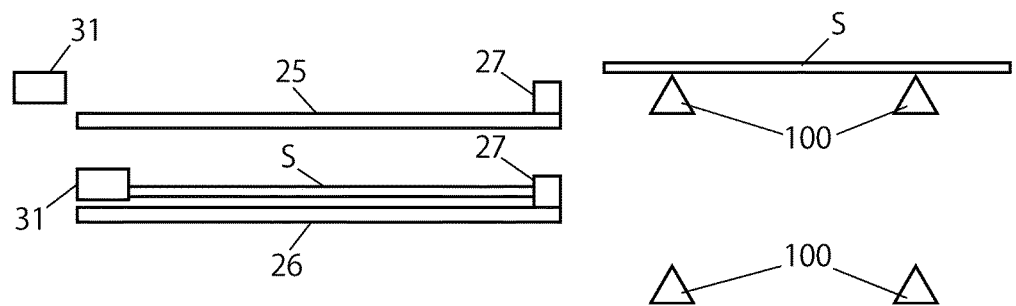
FIG. 11A is a schematic view illustrating another operation when placing an unprocessed substrate and receiving a processed substrate using the substrate conveying robot illustrated in FIG. 1.

First, as illustrated in FIG. 11A, the upper blade member is made into the substrate non-holding state and the lower blade member is made into the substrate holding state.

Figure 11B:
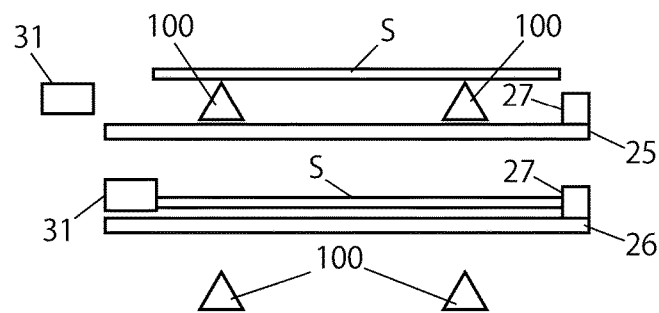
FIG. 11B is another schematic view illustrating another operation when placing an unprocessed substrate and receiving a processed substrate using the substrate conveying robot illustrated in FIG. 1.

Next, the robot arm 4 is driven so as to advance the upper blade member 25 and the lower blade member 26 between the upper stage and the lower stage of the substrate placing structure 100 as illustrated in FIG. 11B (blade member advancing operation). At this time, the lower blade member 26 and the upper blade member 25 are advanced so that the substrate S held by the blade member 26 is arranged in a position corresponding to the substrate placing position of the lower stage of the substrate placing structure 100.

Figure 11C:
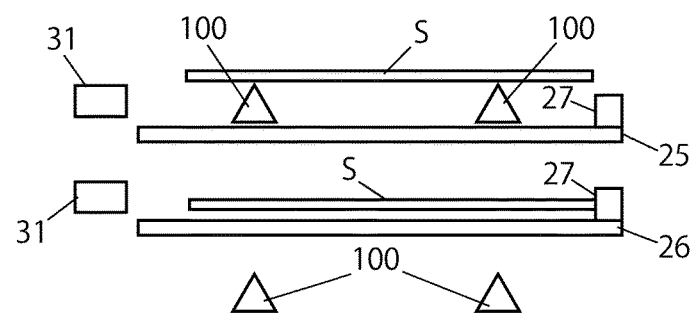
FIG. 11C is another schematic view illustrating another operation when placing an unprocessed substrate and receiving a processed substrate using the substrate conveying robot illustrated in FIG. 1.
Figure 11D:
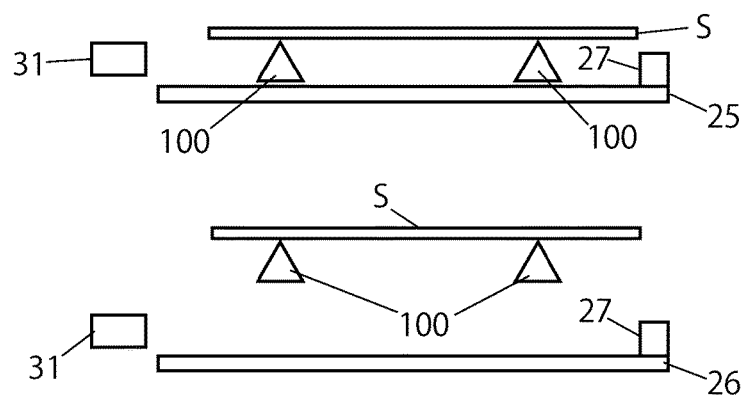
FIG. 11D is another schematic view illustrating another operation when placing an unprocessed substrate and receiving a processed substrate using the substrate conveying robot illustrated in FIG. 1.

Next, as illustrated in FIG. 11C, the lower pressing air cylinder 30 is driven so as to retreat the movable gripping portion 31 of the lower hand 14 to the non-gripping position. Next, the lower elevating air cylinder 22 is driven so as to lower the lower blade member 26 as illustrated in FIG. 11D and place the substrate S on the lower stage of the substrate placing structure 100. Thereby, the substrate placing operation by the lower hand 14 is completed.

Figure 11E:
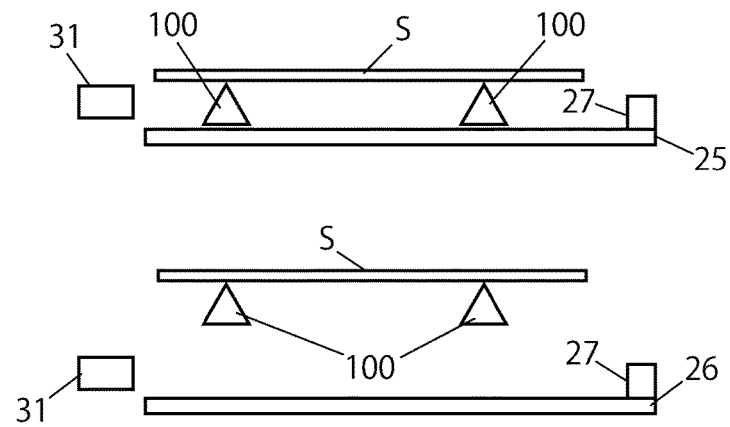
FIG. 11E is another schematic view illustrating another operation when placing an unprocessed substrate and receiving a processed substrate using the substrate conveying robot illustrated in FIG. 1.

Next, the robot arm 4 is driven so as to advance the upper blade member 25 and the lower blade member 26 until the fixed gripping portion 27 of the upper blade member 25 slightly exceeds the position of a distal edge portion of the substrate S placed on the upper stage of the substrate placing structure 100 as illustrated in FIG. 11E.

Figure 11F:
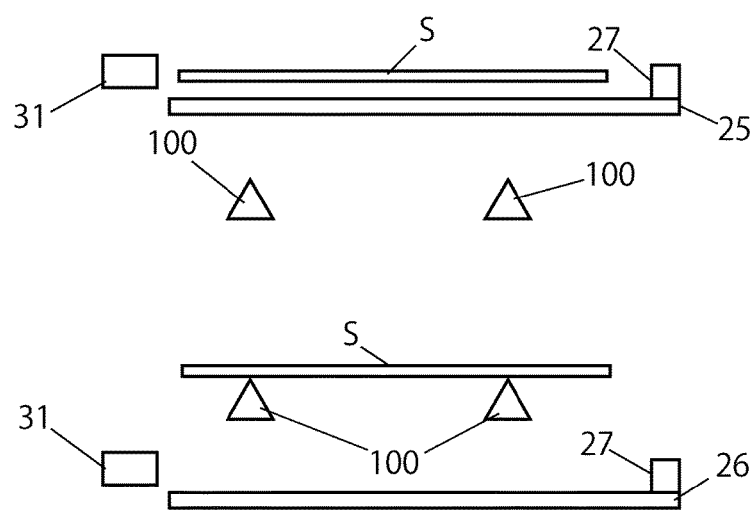
FIG. 11F is another schematic view illustrating another operation when placing an unprocessed substrate and receiving a processed substrate using the substrate conveying robot illustrated in FIG. 1.

Next, in the state that the movable gripping portion 31 of the upper hand 13 is retreated to the non-gripping position, the upper elevating air cylinder 21 is driven so as to elevate the upper blade member 25 and receive the substrate S by the upper blade member 25 as illustrated in FIG. 11F. At this time, the fixed gripping portion 27 of the upper blade member 25 is arranged in a position slightly exceeding the distal edge portion of the substrate S placed on the upper stage of the substrate placing structure 100, and therefore the substrate S does not get on the protrusion part configuring the fixed gripping portion 27.

Figure 11G:
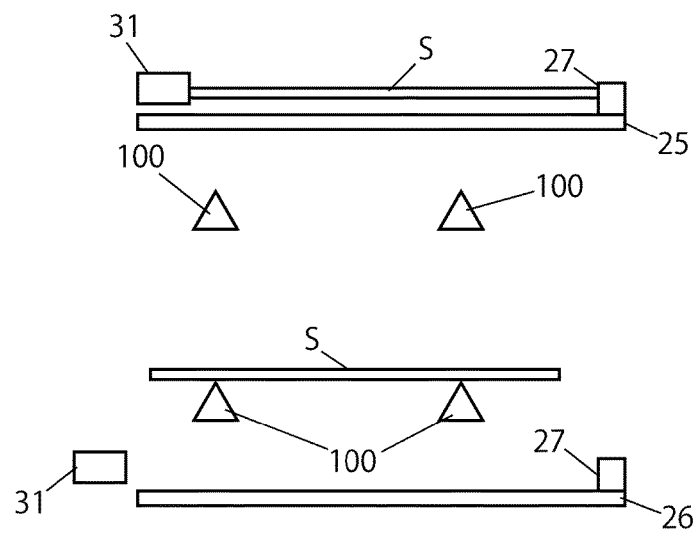
FIG. 11G is another schematic view illustrating another operation when placing an unprocessed substrate and receiving a processed substrate using the substrate conveying robot illustrated in FIG. 1.

Next, the upper pressing air cylinder 29 is driven so as to advance the movable gripping portion 31 of the upper hand 13, and the substrate S is gripped and held by the movable gripping portion 31 of the upper hand 13 and the fixed gripping portion 27 as illustrated in FIG. 11G. Thereby, the holding operation of the substrate S by the upper hand 13 is completed.

Figure 11H:
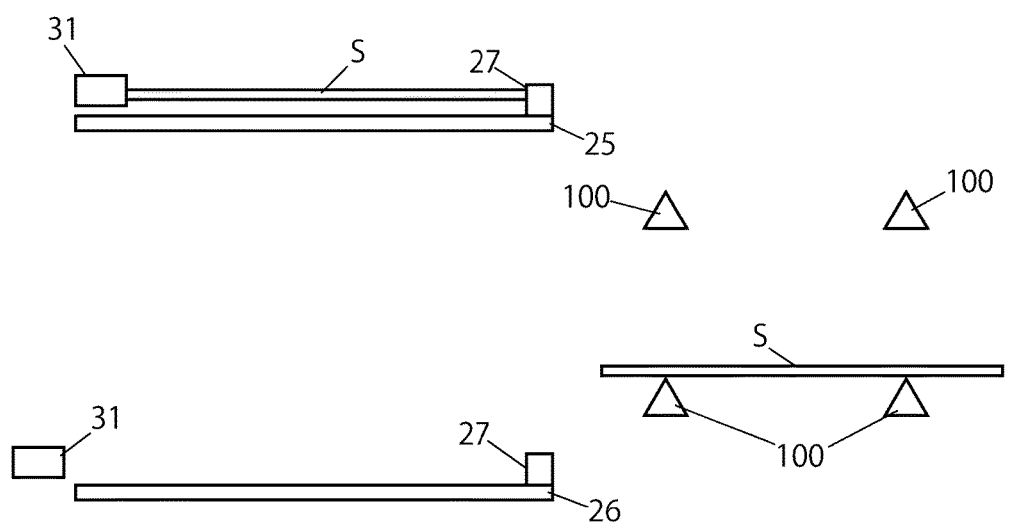
FIG. 11H is another schematic view illustrating another operation when placing an unprocessed substrate and receiving a processed substrate using the substrate conveying robot illustrated in FIG. 1.

Next, the robot arm 4 is driven so as to retreat the upper blade member 25 and the lower blade member 26 and convey the processed substrate S to another substrate placing structure as illustrated in FIG. 11H.

As described above using FIG. 11A to 11H, a timing to place the unprocessed substrate S by the substrate placing operation and a timing to receive the processed substrate S by the substrate receiving operation are deviated from each other when receiving the unprocessed substrate S and placing the processed substrate S using the substrate conveying robot 1 according to the embodiment. Thereby, the upper blade member 25 can be arranged in a position slightly overreaching forward (in the distal direction) so that the substrate S does not get on the protrusion part configuring the fixed gripping portion 27 in the substrate receiving operation.

Also, when the processed substrate S is a cleaned substrate, adhesion of particles to the substrate S due to downflow for keeping cleanliness in a semiconductor manufacturing area can be prevented by always holding the processed substrate S by the upper blade member 25.

Next, another operation when driving the robot arm 4, the substrate holding device 7, and the Z-axis elevating drive source 8 by the above-stated robot controller 12 so as to receive the processed substrate S from the upper stage of the substrate placing structure 100 and place the unprocessed substrate S on the lower stage of the substrate placing structure 100 will be described referring to FIG. 12A to FIG. 12E.

Figure 12A:
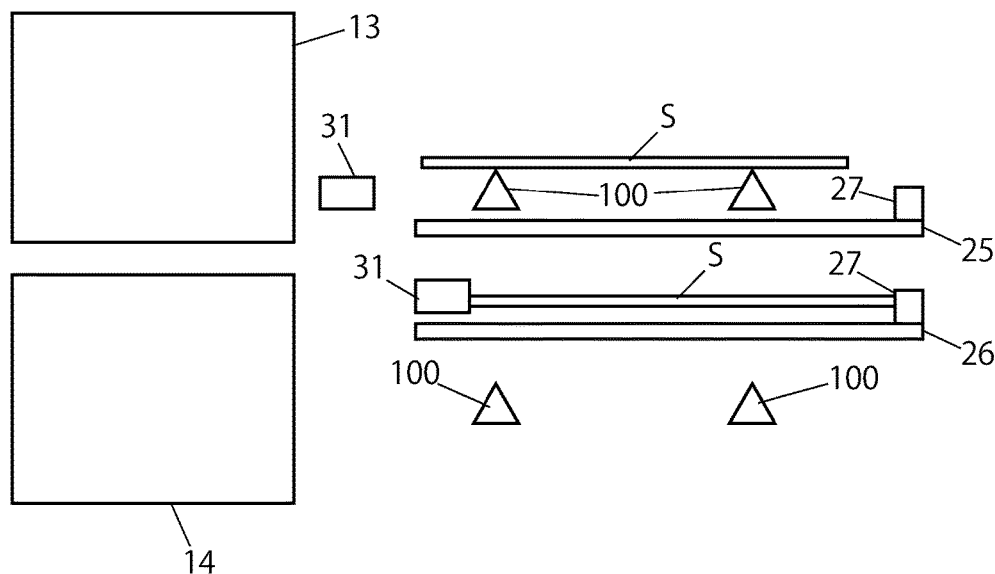
FIG. 12A is a schematic view illustrating further another operation when receiving a processed substrate and placing an unprocessed substrate using the substrate conveying robot illustrated in FIG. 1.

First, as illustrated in FIG. 12A, the upper blade member 25 is made into the substrate non-holding state and the lower blade member 26 is made into the substrate holding state. Then the upper blade member 25 and the lower blade member 26 are advanced between the upper stage and the lower stage of the substrate placing structure 100 (blade member advancing operation). At this time, the upper blade member 25 and the lower blade member 26 are advanced until the fixed gripping portion 27 of the upper blade member 25 slightly exceeds the position of a distal edge portion of the substrate S placed on the upper stage of the substrate placing structure 100.

Figure 12B:
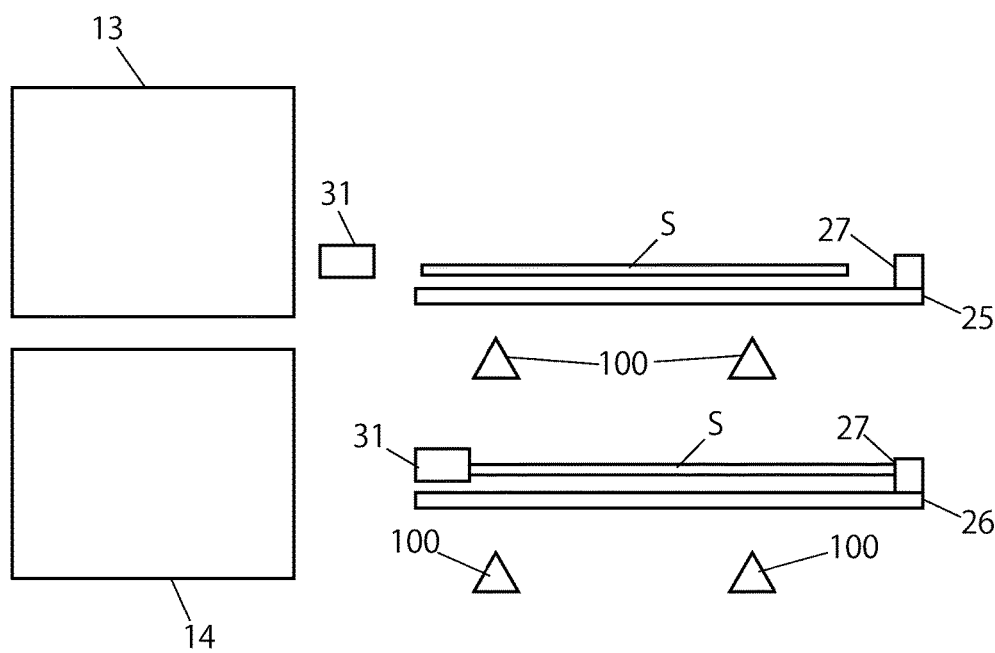
FIG. 12B is another schematic view illustrating further another operation when receiving a processed substrate and placing an unprocessed substrate using the substrate conveying robot illustrated in FIG. 1.

Next, the Z-axis elevating drive source 8 having a servo motor is driven so as to elevate the upper hand 13 and the lower hand 14 and receive the substrate S by the upper blade member 25 in the state that the movable gripping portion 31 of the upper hand 13 is retreated to the non-gripping position as illustrated in FIG. 12B (substrate receiving operation). At this time, the fixed gripping portion 27 of the upper blade member 25 is arranged in a position slightly exceeding the distal edge portion of the substrate S placed on the upper stage of the substrate placing structure 100. Therefore, the substrate S is prevented from getting on the protrusion part configuring the fixed gripping portion 27.

In the substrate receiving operation, the lower elevating air cylinder 22 is driven so as to lower the lower blade member 26 according to the elevating operation of the upper hand 13 and the lower hand 14 by the Z-axis elevating drive source 8. Thereby, the unprocessed substrate S held by the lower blade member 26 does not come into contact with the lower stage of the substrate placing structure 100.

Figure 12C:
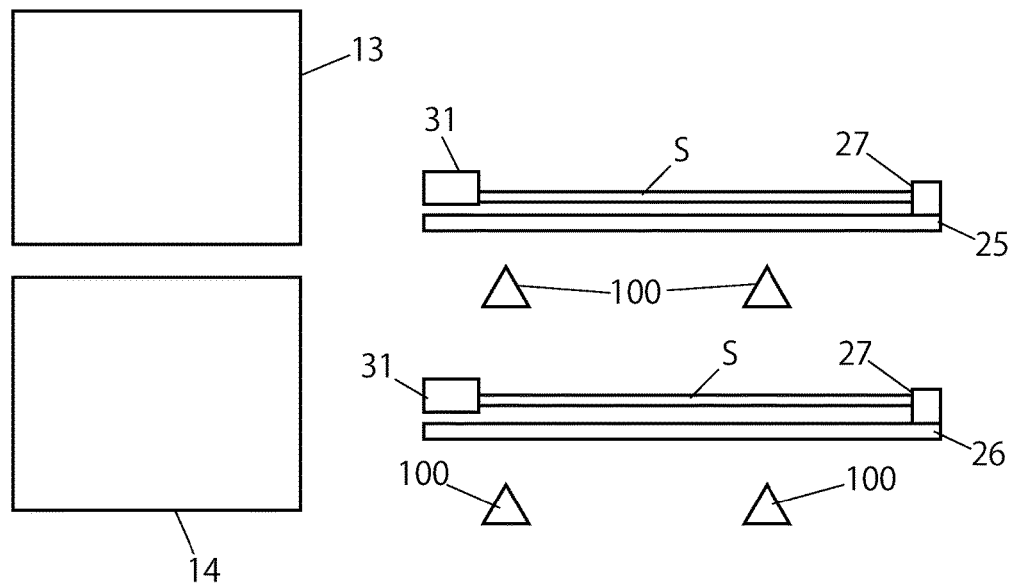
FIG. 12C is another schematic view illustrating further another operation when receiving a processed substrate and placing an unprocessed substrate using the substrate conveying robot illustrated in FIG. 1.

Next, the upper pressing air cylinder 29 is driven so as to advance the movable gripping portion 31 of the upper hand 13 and grip and hold the substrate S by the movable gripping portion 31 of the upper hand 13 and the fixed gripping portion 27 as illustrated in FIG. 12C. Thereby, the holding operation of the substrate S by the upper hand 13 is completed.

The robot arm 4 is driven so as to slightly retreat the upper hand 13 and the lower hand 14 at the same time as the above-stated substrate receiving operation or after the substrate receiving operation is completed so that the substrate S held by the lower hand 14 is arranged above the placing position of the lower stage of the substrate placing structure 100, as illustrated in FIG. 12C.

Figure 12D:
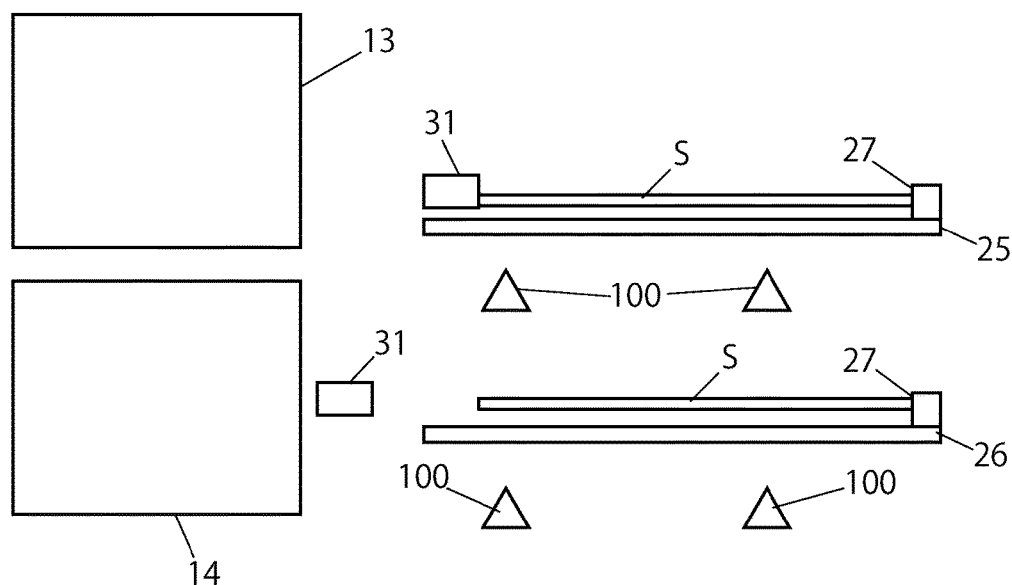
FIG. 12D is another schematic view illustrating further another operation when receiving a processed substrate and placing an unprocessed substrate using the substrate conveying robot illustrated in FIG. 1.
Figure 12E:
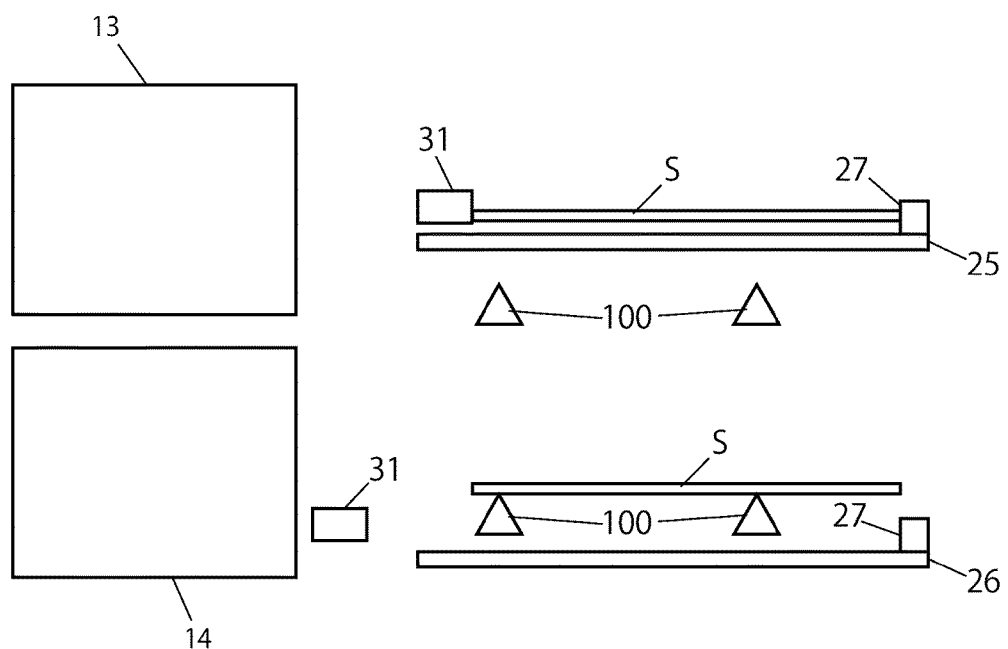
FIG. 12E is another schematic view illustrating further another operation when receiving a processed substrate and placing an unprocessed substrate using the substrate conveying robot illustrated in FIG. 1.

Next, the lower pressing air cylinder 30 is driven so as to retreat the movable gripping portion 31 of the lower hand 14 to the non-gripping position, as illustrated in FIG. 12D. Next, Z-axis elevating drive source 8 is driven so as to lower the upper hand 13 and the lower hand 14 and place the unprocessed substrate S on the lower blade member 26 onto the lower stage of the substrate placing structure 100, as illustrated in FIG. 12E. Thereby, the substrate placing operation by the lower hand 14 is completed.

In the substrate placing operation, the upper elevating air cylinder 21 is driven so as to elevate the upper blade member 25 according to the lowering operation of the upper hand 13 and the lower hand 14 by the Z-axis elevating drive source 8. Thereby, the processed substrate S held by the upper blade member 25 does not come into contact with the upper stage of the substrate placing structure 100.

As described above using FIG. 12A to 12E, when receiving the processed substrate S and placing the unprocessed substrate S using the substrate conveying robot according to the embodiment, the substrate receiving operation is executed using the Z-axis elevating drive source 8 having a servo motor. Therefore, the substrate receiving operation can be executed while minimizing impact on the processed substrate S when receiving the substrate. Therefore, the processed substrate S can be held while surely preventing the processed substrate S, to which an alignment process is applied by an aligner, from being displaced in receiving the substrate, for example.

Also, as the Z-axis elevating drive source 8 having a servo motor is used for the substrate receiving operation and the substrate placing operation, more flexible response becomes possible even when a substrate placing pitch differs for each substrate placing structure 100.

Note that, in the substrate conveying robot 1 according to the embodiment, the four pitches of the maximum pitch, the minimum pitch, the lower middle pitch, the upper middle pitch can be switched appropriately therebetween with regard to the vertical arrangement state of the upper blade member 25 and the lower blade member 26 as stated above. Therefore, it can flexibly respond to various kinds of substrate placing structures 100 with different substrate placing pitches even when the Z-axis elevating drive source 8 is not used for the substrate receiving operation and/or the substrate placing operation.

Also, when the processed substrate S is a cleaned substrate, adhesion of particles to the substrate S due to downflow for keeping cleanliness in a semiconductor manufacturing area can be prevented by always holding the processed substrate S by the upper blade member 25.

Next, a preprocess when performing the substrate receiving operation and the substrate placing operation above using the substrate conveying robot 1 according to the embodiment will be described referring to FIG. 13A to FIG. 13D. The preprocess is particularly effective for carrying-in and carrying-out of the substrate S from the substrate placing structure 100 storing a lot of substrates S such as the FOUP.

Figure 13A:
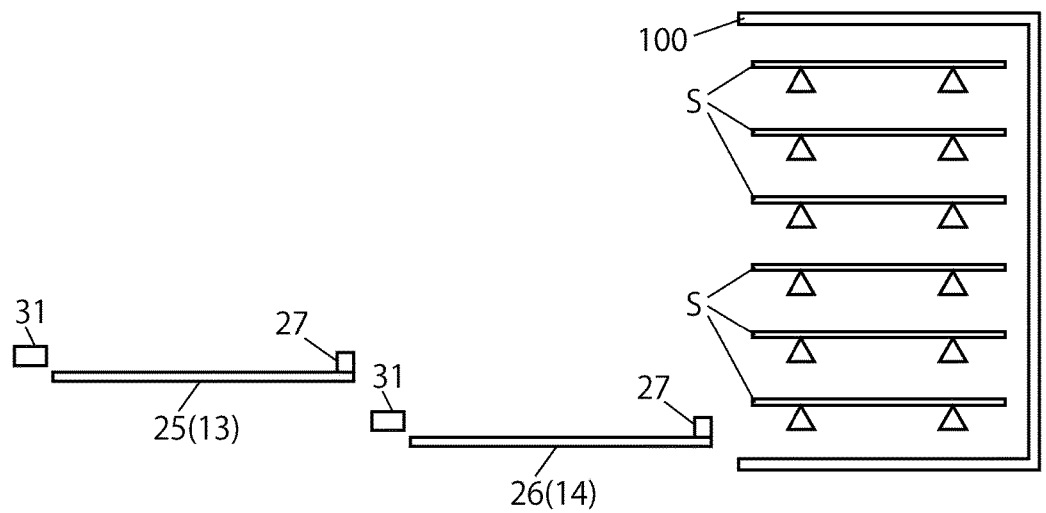
FIG. 13A is a schematic view illustrating an operation when receiving a substrate in the lowermost stage of the substrate placing structure using the substrate conveying robot illustrated in FIG. 1.
Figure 13B:
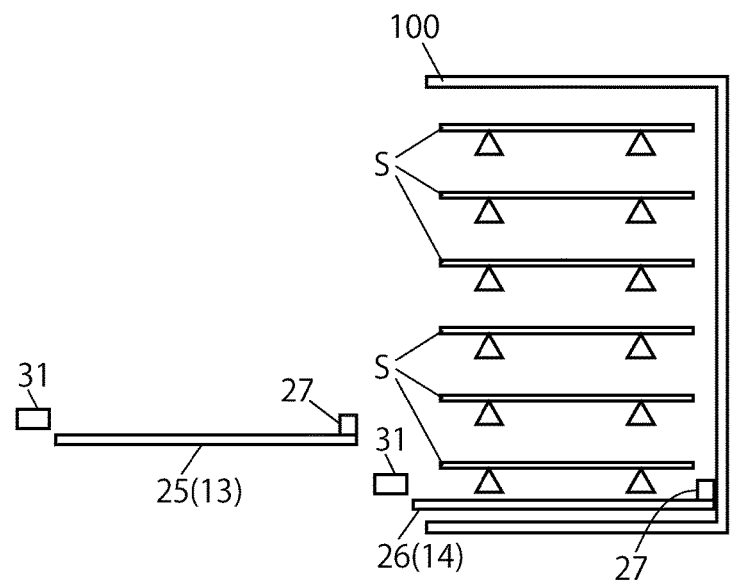
FIG. 13B is another schematic view illustrating an operation when receiving a substrate in the lowermost stage of the substrate placing structure using the substrate conveying robot illustrated in FIG. 1.

Prior to the substrate receiving operation and the substrate placing operation above, in the state that the upper hand 13 is in the non-working position as illustrated in FIG. 13A, the robot arm 4 is driven so as to advance the lower blade member 26 below the lowermost substrate S of the substrate placing structure 100, as illustrated in FIG. 13B.

Figure 13C:
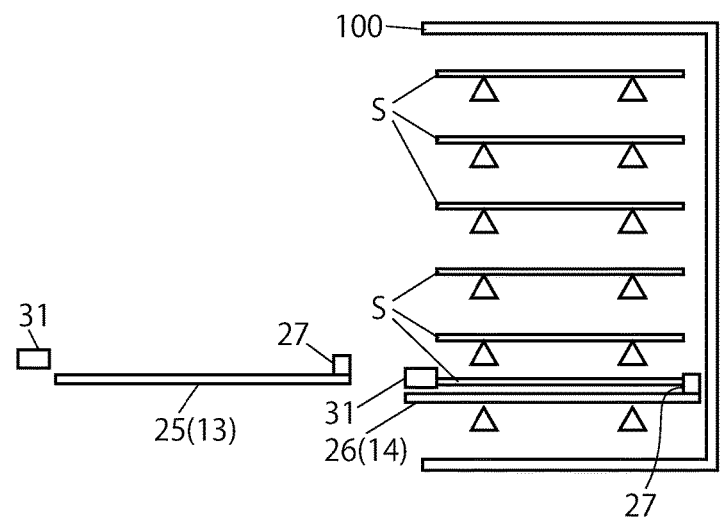
FIG. 13C is another schematic view illustrating an operation when receiving a substrate in the lowermost stage of the substrate placing structure using the substrate conveying robot illustrated in FIG. 1.
Figure 13D:
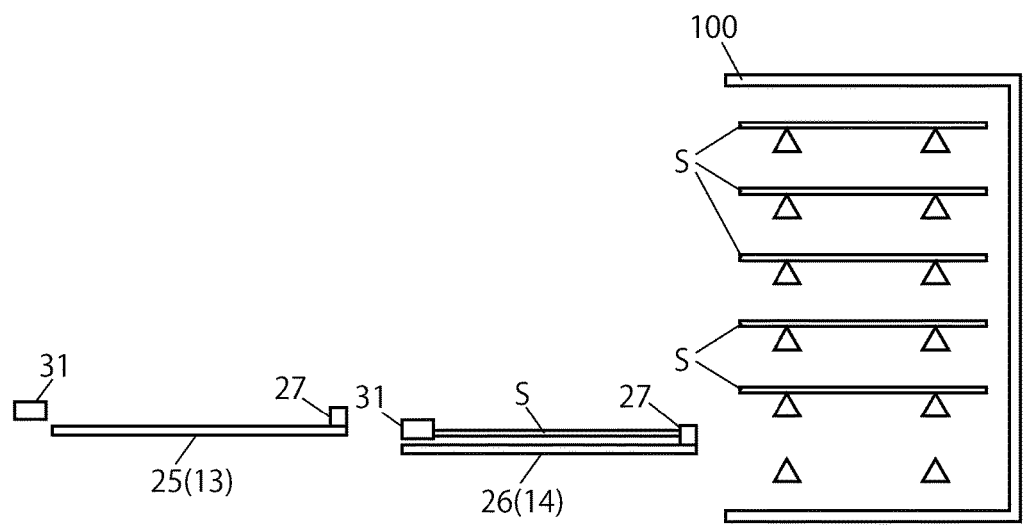
FIG. 13D is another schematic view illustrating an operation when receiving a substrate in the lowermost stage of the substrate placing structure using the substrate conveying robot illustrated in FIG. 1.

Next, as illustrated in FIG. 13C, the Z-axis elevating drive source 8 is driven so as to elevate the upper hand 13 and the lower hand 14 and receive the lowermost substrate S by the lower blade member 26 (lowermost stage substrate receiving operation). Next, the robot arm 4 is driven so as to retreat the upper blade member 25 and the lower blade member 26 and carry out the lowermost substrate S from the substrate placing structure 100 as illustrated in FIG. 13D.

Thereby, the lowermost stage of the substrate placing structure 100 becomes empty. Therefore, carrying-out of the unprocessed substrate S stored in the substrate placing structure 100 and carrying-in of the processed substrate S to the substrate placing structure 100 can be executed in order by the substrate receiving operation and the substrate placing operation above.

Note that, when there is a possibility that the processed substrate S held by the lower blade member 26 comes in contact with a back wall of the substrate placing structure 100 such as the FOUP when the upper blade member and the lower blade member 26 are advanced into the substrate placing structure 100, the movable gripping portion 31 of the lower hand 14 is previously retreated to the non-gripping position.

Next, another example of the preprocess when performing the substrate receiving operation and the substrate placing operation above using the substrate conveying robot 1 according to the embodiment will be described referring to FIG. 14A to FIG. 14C.

Figure 14A:
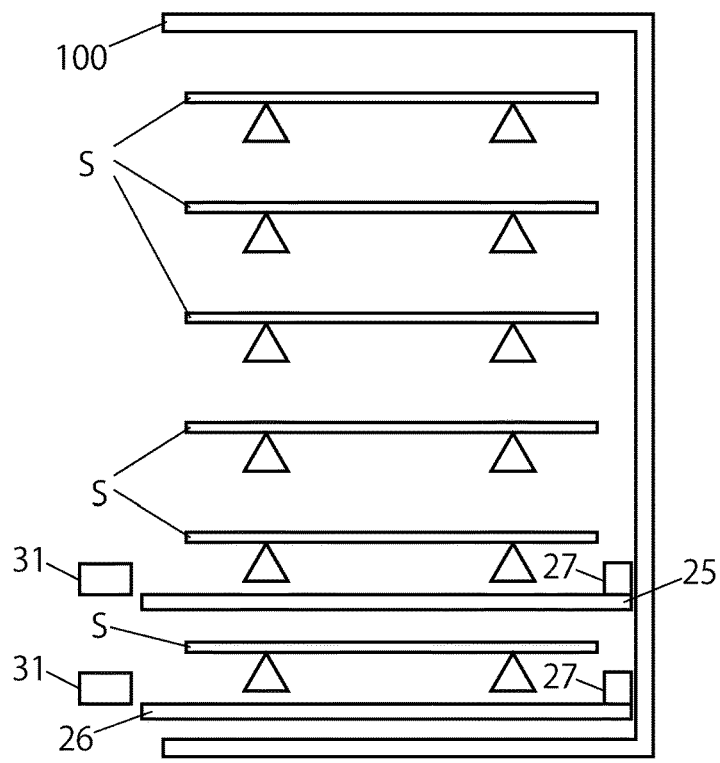
FIG. 14A is a schematic view illustrating another operation when receiving a substrate in the lowermost stage of the substrate placing structure using the substrate conveying robot illustrated in FIG. 1.
Figure 14B:
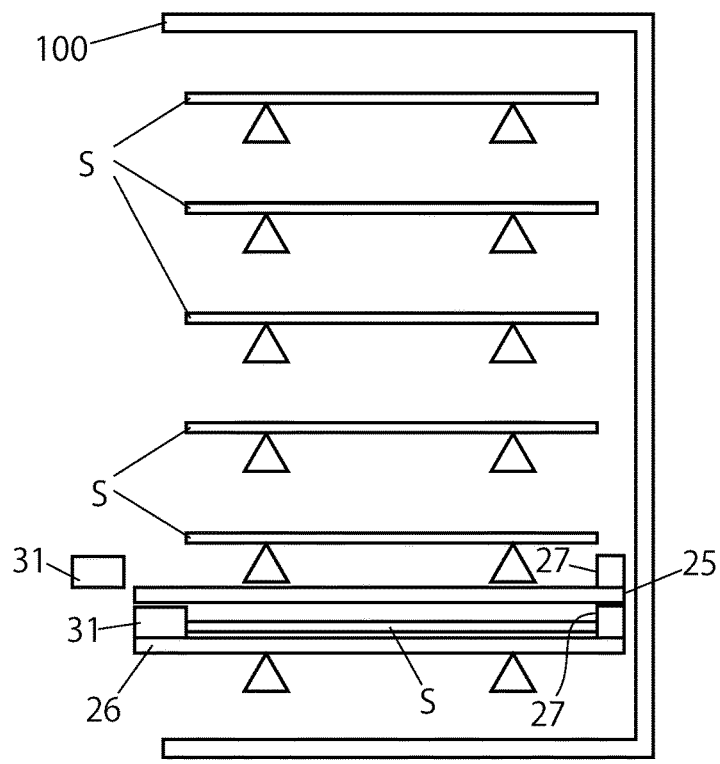
FIG. 14B is another schematic view illustrating another operation when receiving a substrate in the lowermost stage of the substrate placing structure using the substrate conveying robot illustrated in FIG. 1.
Figure 14C:
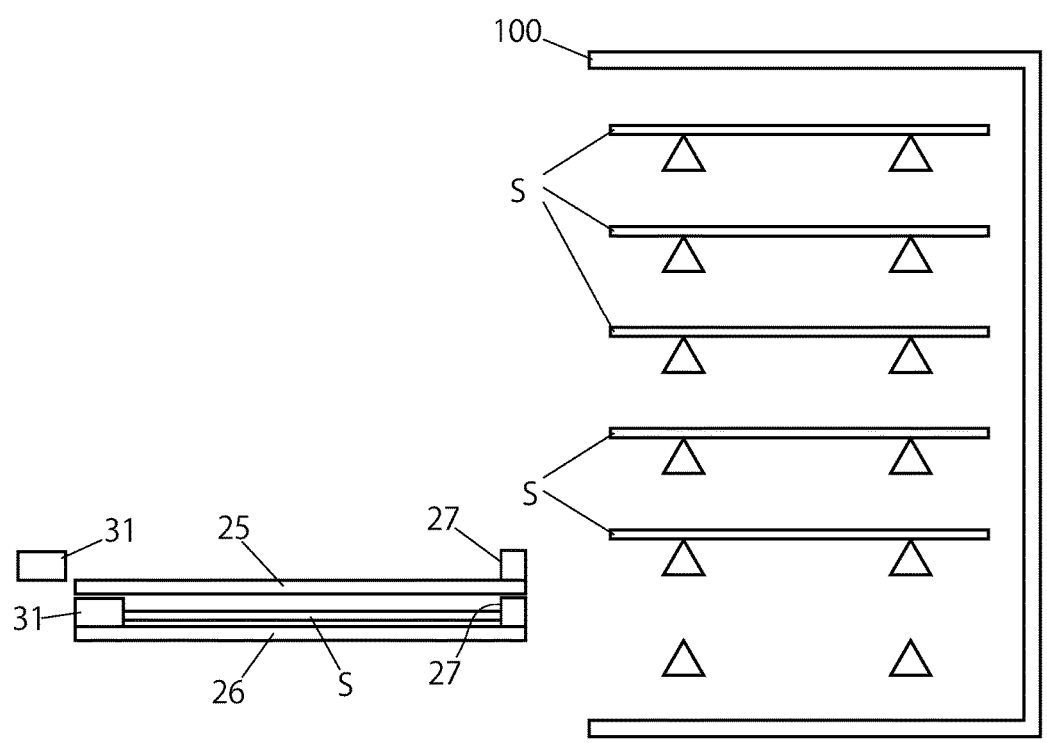
FIG. 14C is another schematic view illustrating another operation when receiving a substrate in the lowermost stage of the substrate placing structure using the substrate conveying robot illustrated in FIG. 1.

Prior to the substrate receiving operation and the substrate placing operation above, as illustrated in FIG. 14A, both the upper blade member 25 and the lower blade member 26 are made into the substrate non-holding state and the robot arm 4 is driven so as to advance the upper blade member 25 and the lower blade member 26 so that the lowermost substrate S of the substrate placing structure 100 is positioned between the upper blade member 25 and the lower blade member 26.

Next, the substrate S placed on the lowermost stage of the substrate placing structure 100 is received by the lower blade member 26 by driving the lower elevating air cylinder 22 and thereby elevating the lower blade member 26 (lowermost stage substrate receiving operation). Next, the robot arm 4 is driven so as to retreat the upper blade member 25 and the lower blade member 26 and carry out the substrate S from the substrate placing structure 100 as illustrated in FIG. 14C.

Thereby, the lowermost stage of the substrate placing structure 100 becomes empty. Therefore, carrying-out of the unprocessed substrate S stored in the substrate placing structure 100 and carrying-in of the processed substrate S to the substrate placing structure 100 can be executed in order by the substrate receiving operation and the substrate placing operation above.

Next, a modified example of the above-stated substrate conveying robot 1 will be described referring to FIG. 15.

Figure 15:
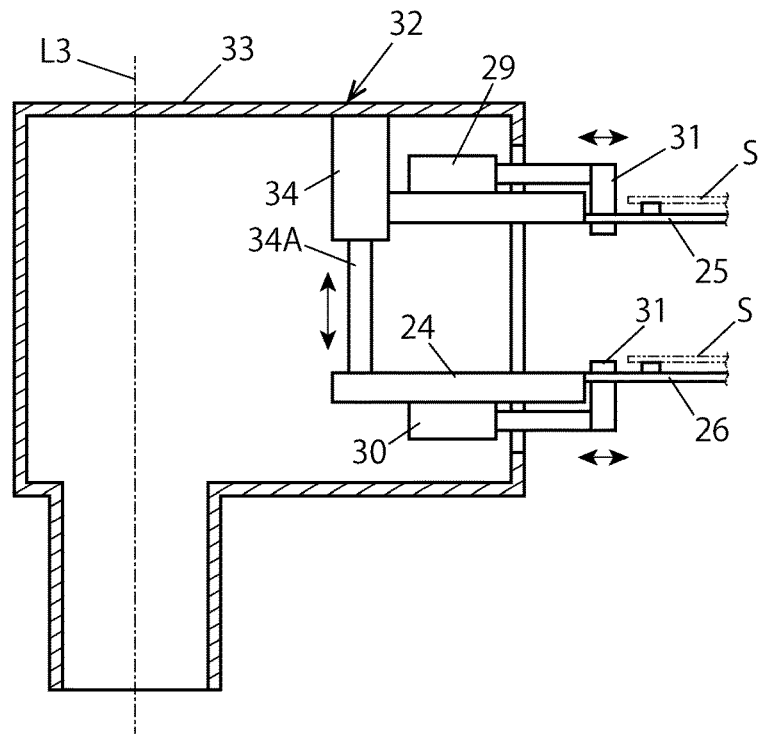
FIG. 15 is a schematic sectional view illustrating the structure of a substrate holding device of another modified example of the substrate conveying robot illustrated in FIG. 1.

The substrate conveying robot according to the modified example has a single hand 32 and the single hand 32 comprises both the upper blade member 25 and the lower blade member 26 as illustrated in FIG. 15.

A single elevating air cylinder 34 is provided inside a hand base portion 33 of the single hand 32. A piston 34A of the single elevating air cylinder 34 is arranged so as to face downward, and a lower elevating member 24 is connected to its lower end. In contrast, the upper blade member 25 is fixed to the hand base portion 32. Namely, only the lower blade member 26 is mounted so as to be elevatable on the hand base portion 33 in the modified example.

The upper blade member 25 is positioned in the opposite side to the side where the piston 34A of the elevating air cylinder 34 is positioned. Thereby, the thickness of the hand base portion 33 can be prevented from increasing even when a long air cylinder is used.

Figure 16:
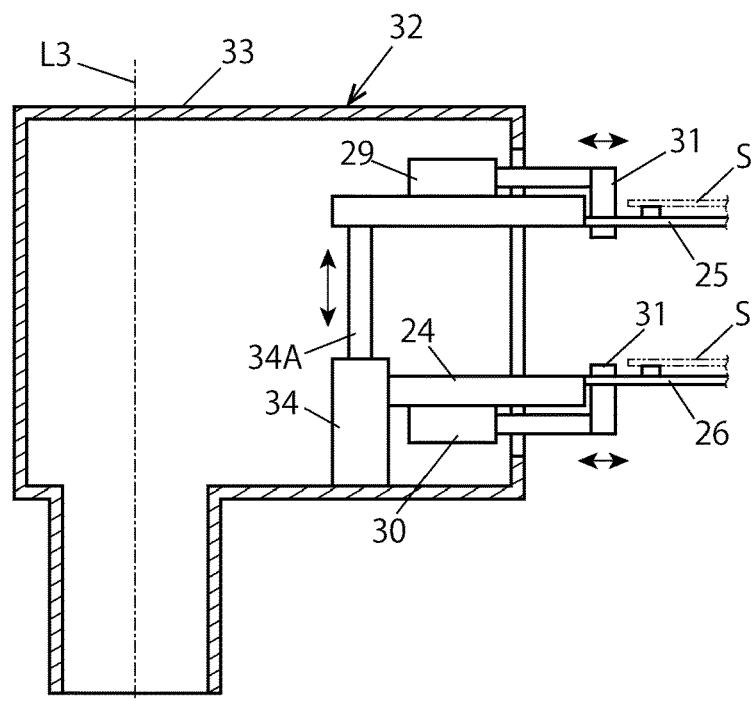
FIG. 16 is a schematic sectional view illustrating the structure of a substrate holding device of another modified example of the substrate conveying robot illustrated in FIG. 1.

FIG. 16 illustrates an example that the upper blade member 25 is made movable and the lower blade member 26 is fixed contrary to the modified example illustrated in FIG. 15. The piston 34A of the single air cylinder 34 is arranged so as to face upward. The thickness of the hand base portion 33 can be prevented from increasing even when a long air cylinder is used in the example as well.

Also in the substrate conveying robot according to each example illustrated in FIG. 15 and FIG. 16, the substrate receiving operation and the substrate placing operation above can be executed by using the Z-axis elevating drive source 8.

Next, another modified example of the above-stated substrate conveying robot 1 will be described referring to FIG. 17.

In the substrate conveying robot according to the modified example, the upper hand 13 is the same as in the substrate conveying robot 1 illustrated in FIG. 1. In contrast, with regard to the lower hand 14, the lower elevating air cylinder 22 is not provided and the lower blade member 26 is fixed to the hand base portion 20.

Also in the substrate conveying robot according to the embodiment, the substrate receiving operation and the substrate placing operation above can be executed by using the Z-axis elevating drive source 8.

Next, another modified example of the above-stated substrate conveying robot 1 will be described referring to FIG. 18 to FIG. 20B.

Figure 17:
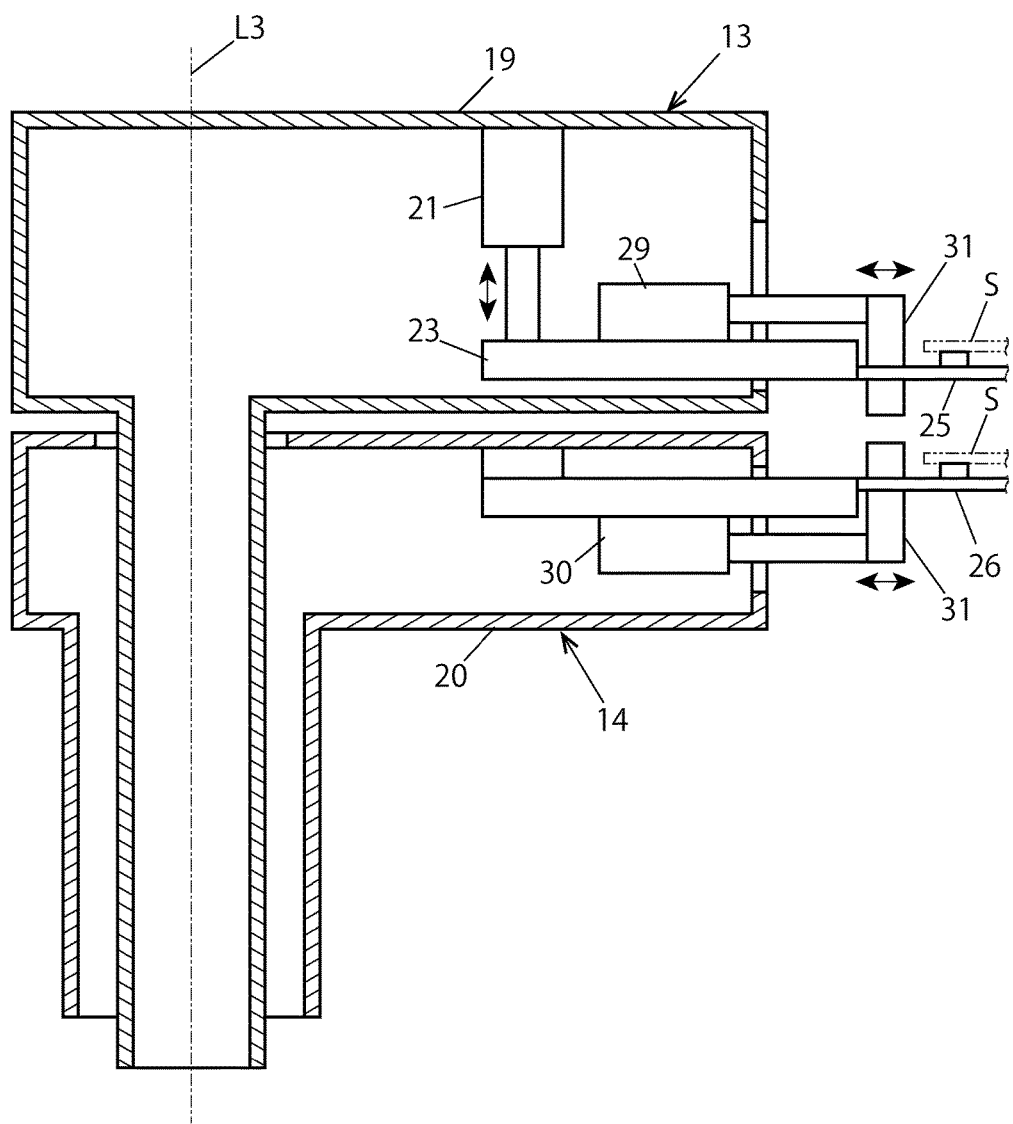
FIG. 17 is a schematic sectional view illustrating the structure of a substrate holding device of another modified example of the substrate conveying robot illustrated in FIG. 1.

The substrate conveying robot according to the modified example is that, in the substrate conveying robot illustrated in FIG. 17, a substrate detection unit 35 is provided to the upper hand 13. The substrate detection unit 35 has a substrate sensor 36 provided on the distal end portion of the movable upper blade member 25 and a sensor amplifier 37 connected to the substrate sensor 36. The substrate sensor 36 can be configured by a transmission type optical sensor or a reflection type optical sensor, for example.

By the substrate conveying robot according the modified example, a proximal edge portion of the single substrate S can be detected by the substrate sensor 36 by driving the upper elevating air cylinder 21, thereby moving the upper blade member 26 in the vertical direction. Accordingly, even when the robot arm 4 itself cannot be operated to be elevated in the state that the robot arm 4 is inserted into a narrow opening portion 101, the upper blade member 25 can detect the presence and absence of the single substrate S by the elevating operation of the upper blade member 25.

Figure 18:
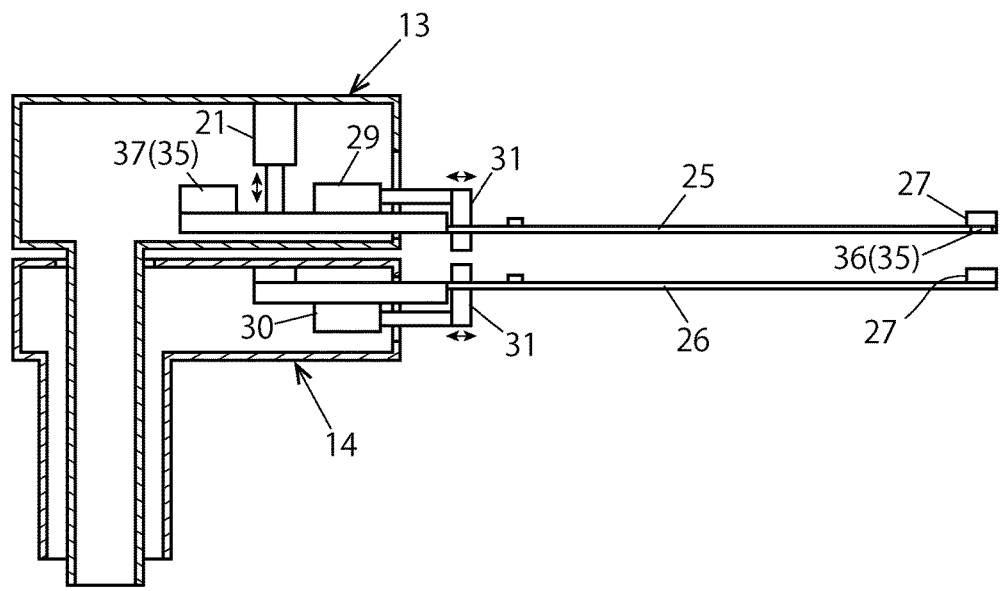
FIG. 18 is a schematic sectional view illustrating a substrate holding device and a substrate detection unit of another modified example of the substrate conveying robot illustrated in FIG. 1.
Figure 19:
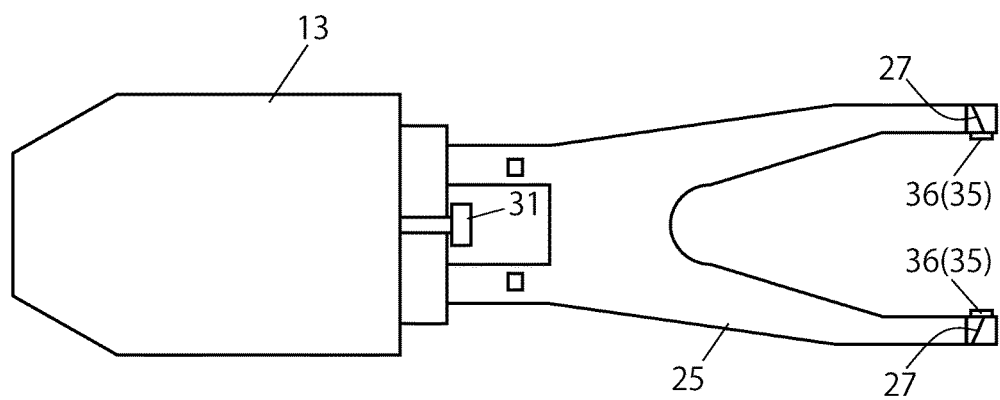
FIG. 19 is a schematic plan view illustrating the substrate holding device and the substrate detection unit of the substrate conveying robot illustrated in FIG. 18.
Figure 20A:
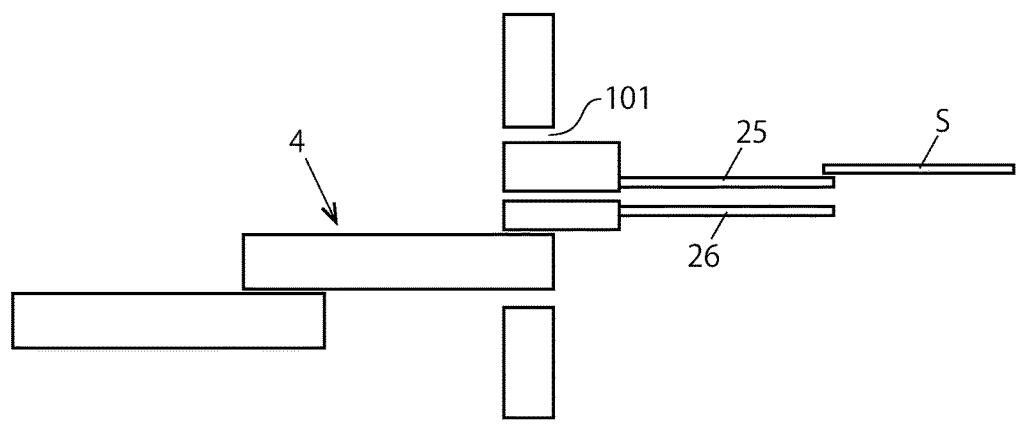
FIG. 20A is a schematic sectional view illustrating an operation when detecting a single substrate using the substrate conveying robot illustrated in FIG. 18 and FIG. 19.
Figure 20B:
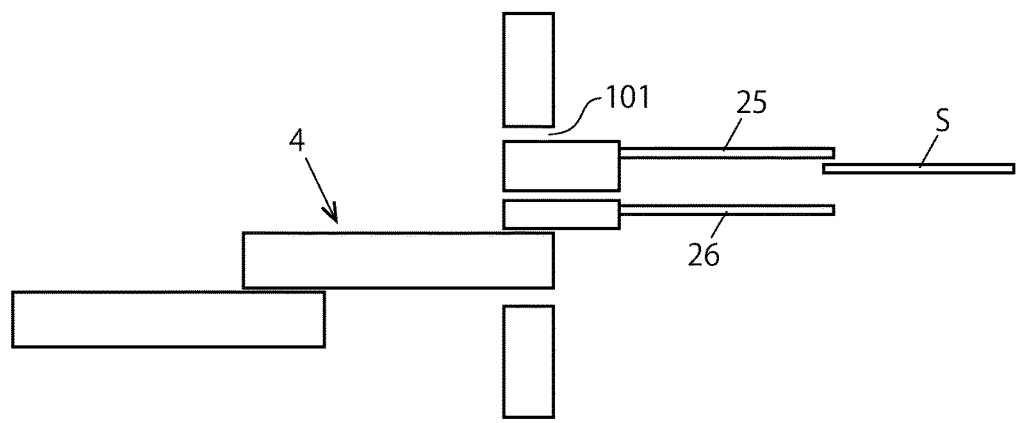
FIG. 20B is another schematic sectional view illustrating an operation when detecting a single substrate using the substrate conveying robot illustrated in FIG. 18 and FIG. 19.
Figure 21:
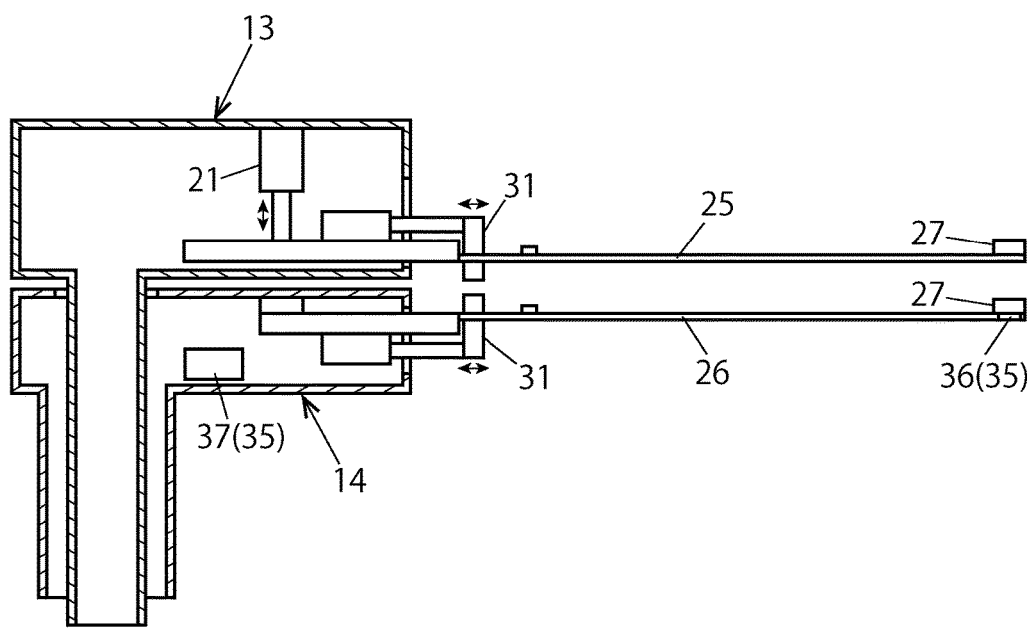
FIG. 21 is a schematic sectional view illustrating the substrate holding device and the substrate detection unit of another modified example of the substrate conveying robot illustrated in FIG. 1.
Figure 22A:
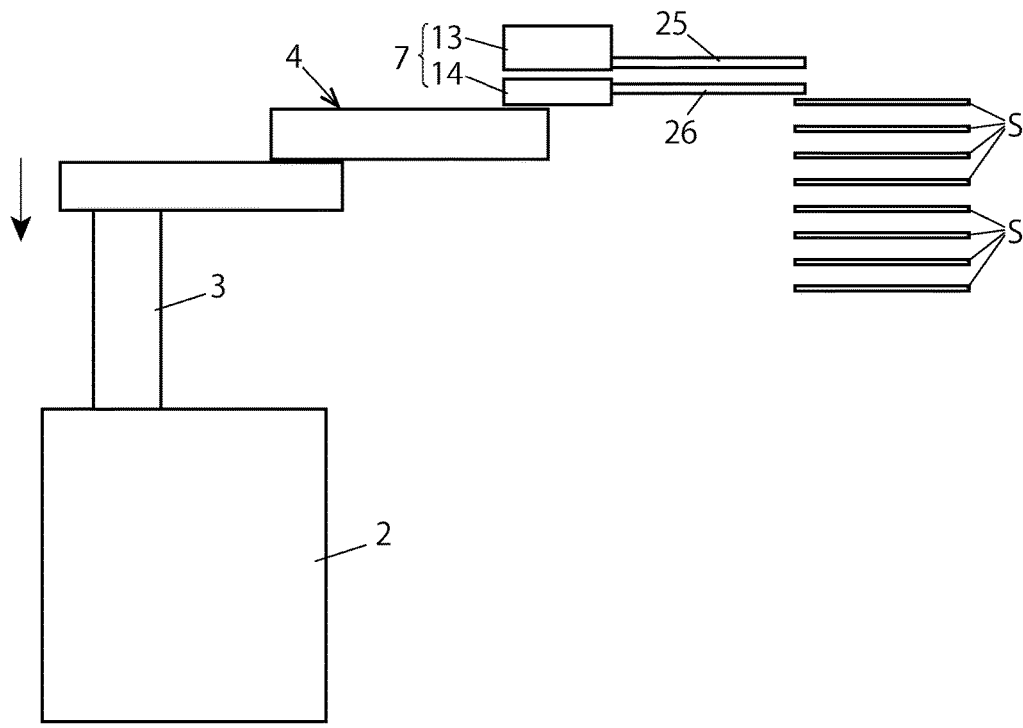
FIG. 22A is a schematic sectional view illustrating an operation when detecting a plurality of substrates using the substrate conveying robot illustrated in FIG. 21.
Figure 22B:
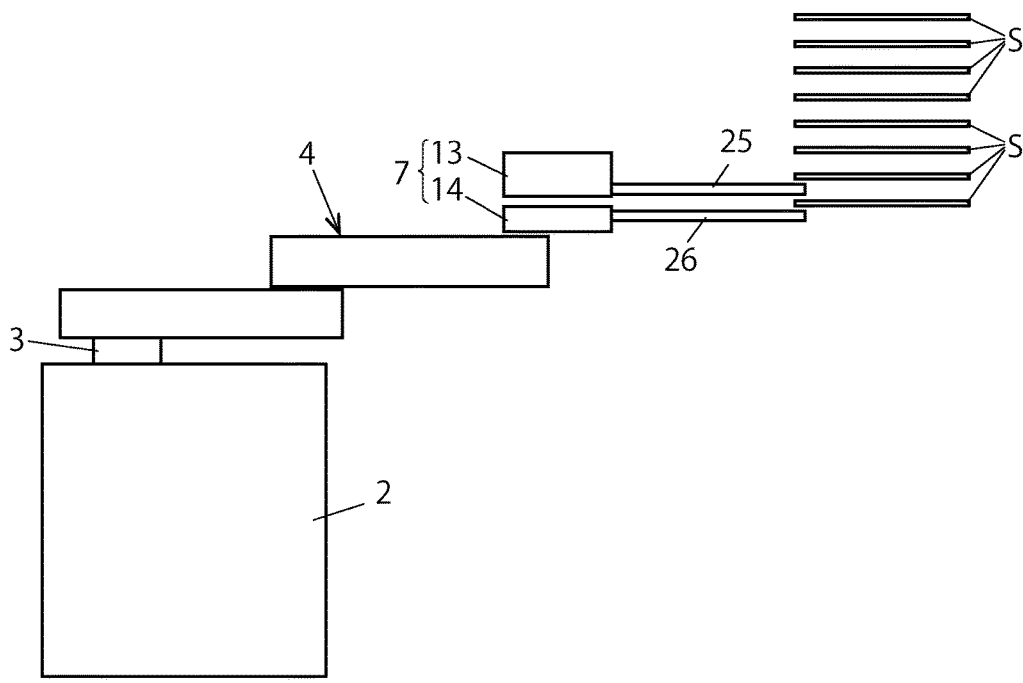
FIG. 22B is another schematic sectional view illustrating an operation when detecting a plurality of substrates using the substrate conveying robot illustrated in FIG. 21.

FIG. 21 illustrates an example that the substrate detection unit 35 is provided to the lower hand 14 having the fixed lower blade member 26, contrary to the example in illustrated FIG. 18. In the example, as illustrated in FIG. 22A and FIG. 22B, the presence and absence of a plurality of substrates S placed in the substrate placing structure 100 can be detected (capable of mapping) by elevating the lower blade member 26 by the Z-axis elevating drive source 8.

By providing the substrate sensor 36 to the fixed lower blade member 26, an optical fiber between the substrate sensor 36 and the sensor amplifier 37 can be handled easily and also the light quantity (detection precision) can be stabilized.

Figure 23:
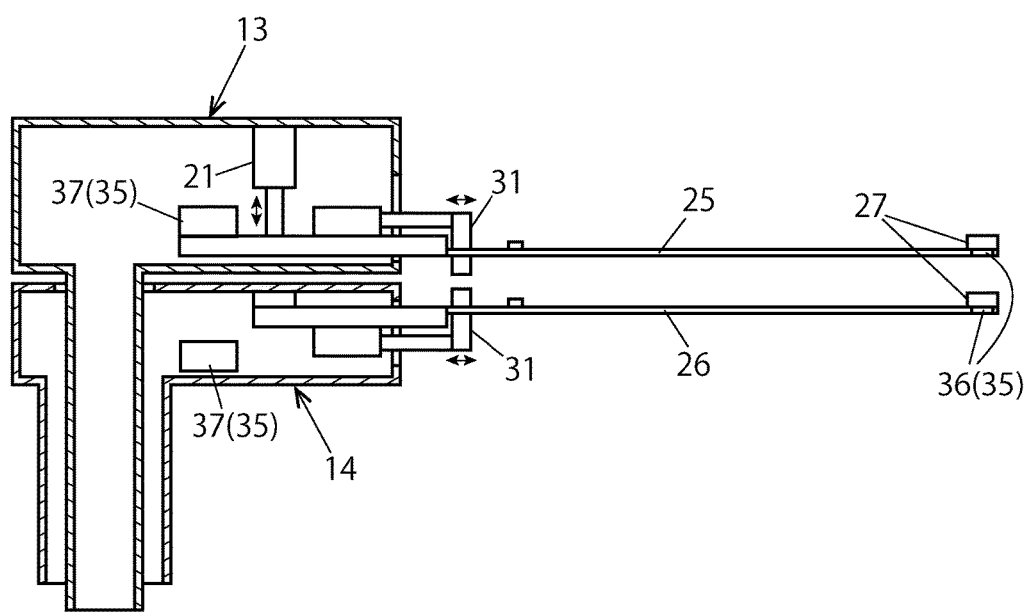
FIG. 23 is a schematic sectional view illustrating the substrate holding device and the substrate detection unit of another modified example of the substrate conveying robot illustrated in FIG. 1.

FIG. 23 illustrates an example that the substrate detection unit 35 is provided to the both the upper hand 13 and the lower hand 14. In the example, both the detection of the single substrate S in the example in FIG. 18 and the detection of a plurality of substrates S in the example in FIG. 21 can be executed.

Note that, also in the example illustrated in FIG. 18, a plurality of substrates S can be detected using the substrate sensor 36 provided to the movable upper blade member 25 by driving the Z-axis elevating drive source 8.

Figure 24:
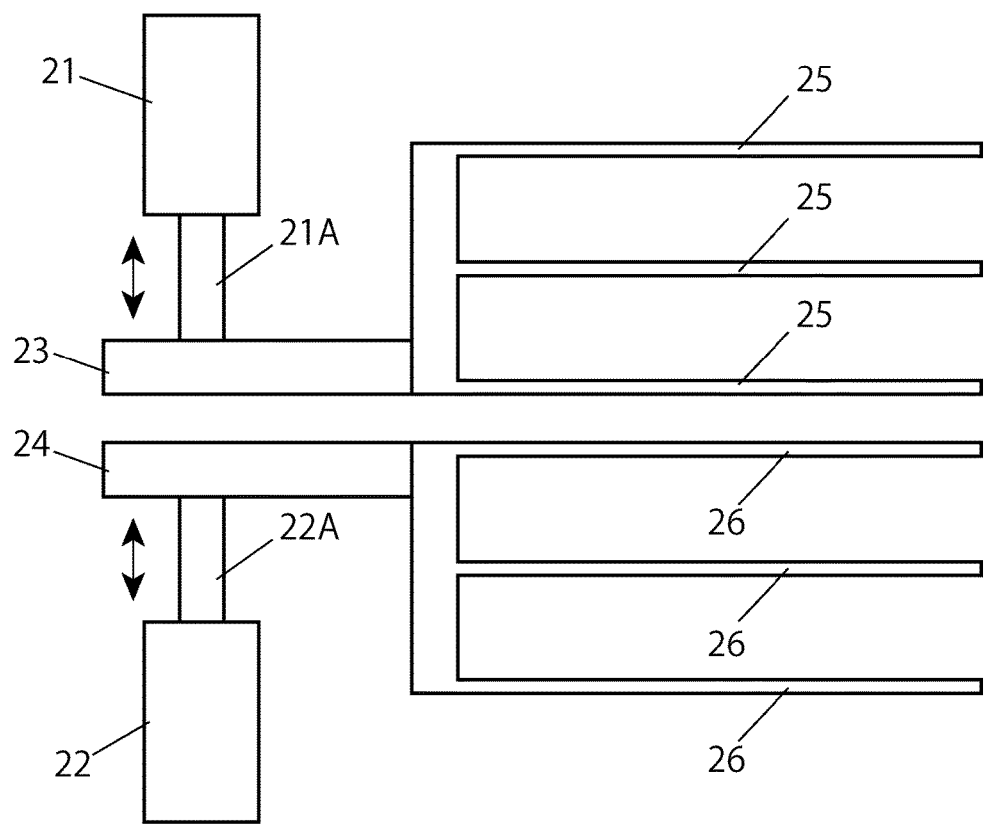
FIG. 24 is a schematic sectional view illustrating the substrate holding device of another modified example of the substrate conveying robot illustrated in FIG. 1.

Next, the substrate conveying robot according to another modified example of the above-stated embodiment will be described referring to FIG. 24 to FIG. 25E.

In the substrate conveying robot according to the example, a plurality of (three in the example) upper blade members 25 whose vertical intervals are mutually fixed are connected to the upper elevating member 23 of the upper hand 13. Similarly, a plurality of (three in the example) lower blade members 26 whose vertical intervals are mutually fixed are connected to the lower elevating member 24 of the lower hand 14 as well.

Figure 25A:
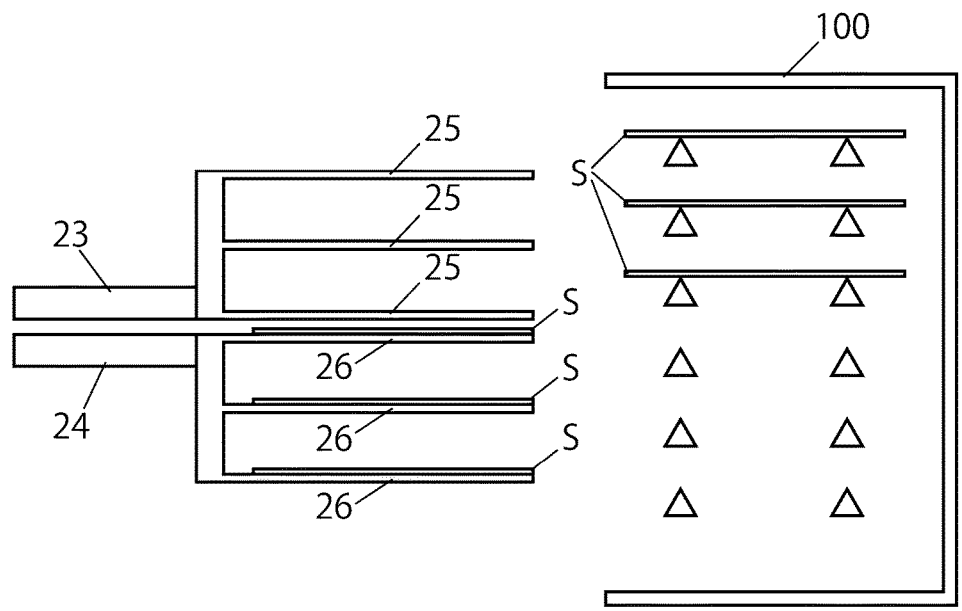
FIG. 25A is a schematic view illustrating an operation when receiving a processed substrate and placing an unprocessed substrate using the substrate conveying robot illustrated in FIG. 24.
Figure 25B:
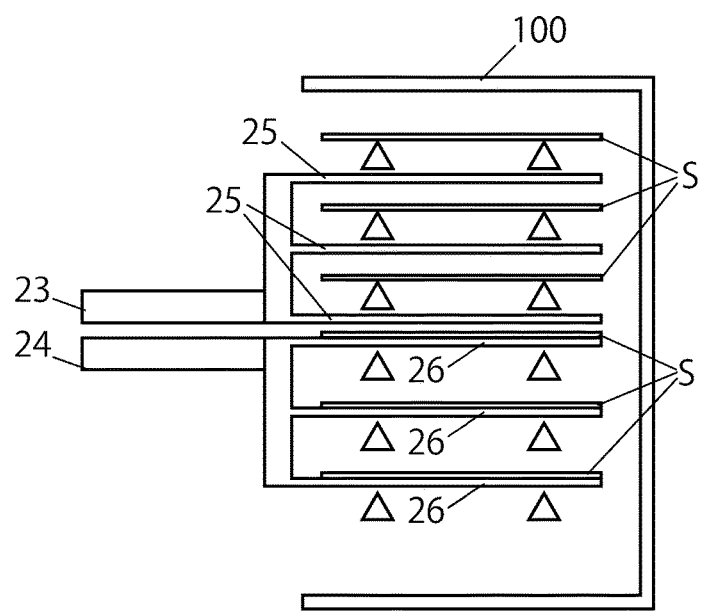
FIG. 25B is another schematic view illustrating an operation when receiving a processed substrate and placing an unprocessed substrate using the substrate conveying robot illustrated in FIG. 24.

When the processed substrate S is carried into the substrate placing structure 100 and the unprocessed substrate S is carried out from the substrate placing structure 100 using the substrate conveying robot according to the example, first, the robot arm 4 is driven in the state that a plurality of processed substrates S are held by a plurality of lower blade members 26 as illustrated in FIG. 25A so as to advance a plurality of lower blades 26 and a plurality of upper blades 25 and make them enter the substrate placing structure 100 as illustrated in FIG. 25B.

Figure 25C:
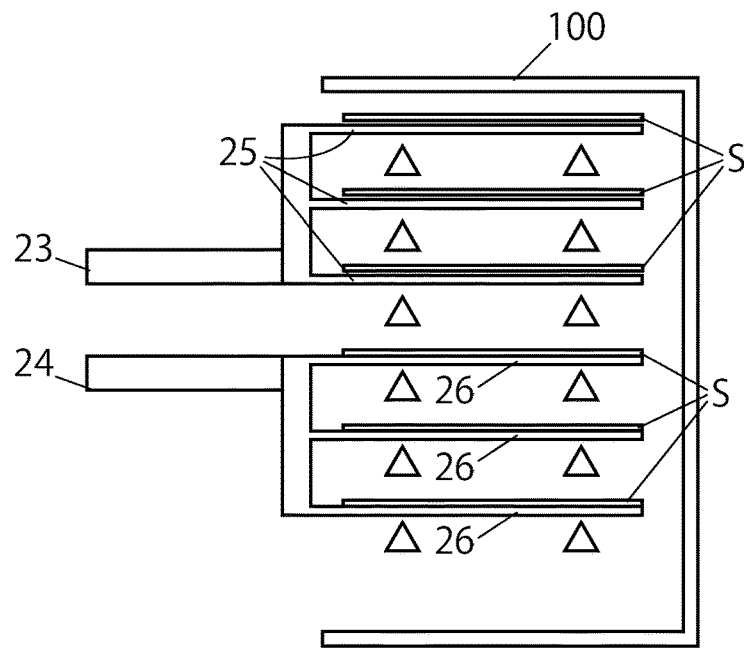
FIG. 25C is another schematic view illustrating an operation when receiving a processed substrate and placing an unprocessed substrate using the substrate conveying robot illustrated in FIG. 24.
Figure 25D:
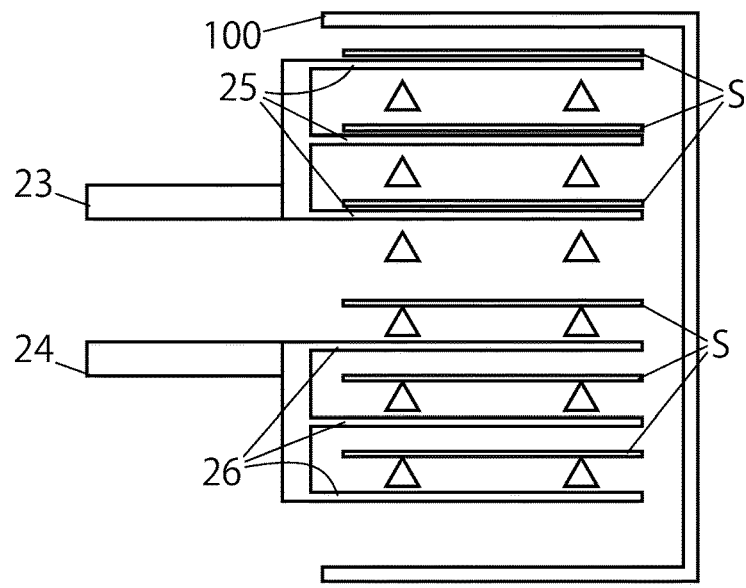
FIG. 25D is another schematic view illustrating an operation when receiving a processed substrate and placing an unprocessed substrate using the substrate conveying robot illustrated in FIG. 24.
Figure 25E:
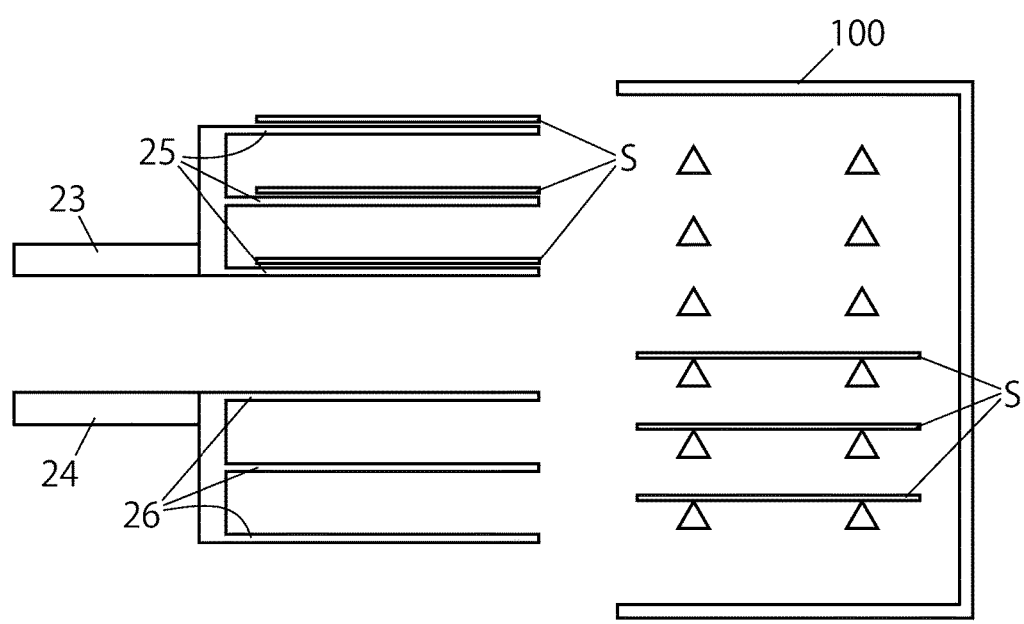
FIG. 25E is another schematic view illustrating an operation when receiving a processed substrate and placing an unprocessed substrate using the substrate conveying robot illustrated in FIG. 24.

Next, as illustrated in FIG. 25C, the upper elevating air cylinder 21 is driven so as to elevate a plurality of upper blade members 25 and hold a plurality of unprocessed substrates S by a plurality of upper blade members 25. Subsequently, the lower elevating air cylinder is driven so as to lower a plurality of lower blade members 26 and place a plurality of processed substrates S in the substrate placing structure 100 by a plurality of lower blade members 26, as illustrated in FIG. 25D. Next, the robot arm 4 is driven so as to retreat a plurality of upper blade members 25 and a plurality of lower blade members 26 and carry out a plurality of unprocessed substrates S from the substrate placing structure 100, as illustrated in FIG. 25E.

In the example, a plurality of processed substrates S can be carried into the substrate placing structure 100 at the same time and a plurality of unprocessed substrates S can be carried out from the substrate placing structure 100 at the same time, and therefore the tact time in conveying substrates can be further shortened.

Note that, it is usually preferable that the installation number of upper blade members 25 and the installation number of lower blade members 26 are the same, both the installation numbers may be different from each other in accordance with purposes of use.

Figure 26:
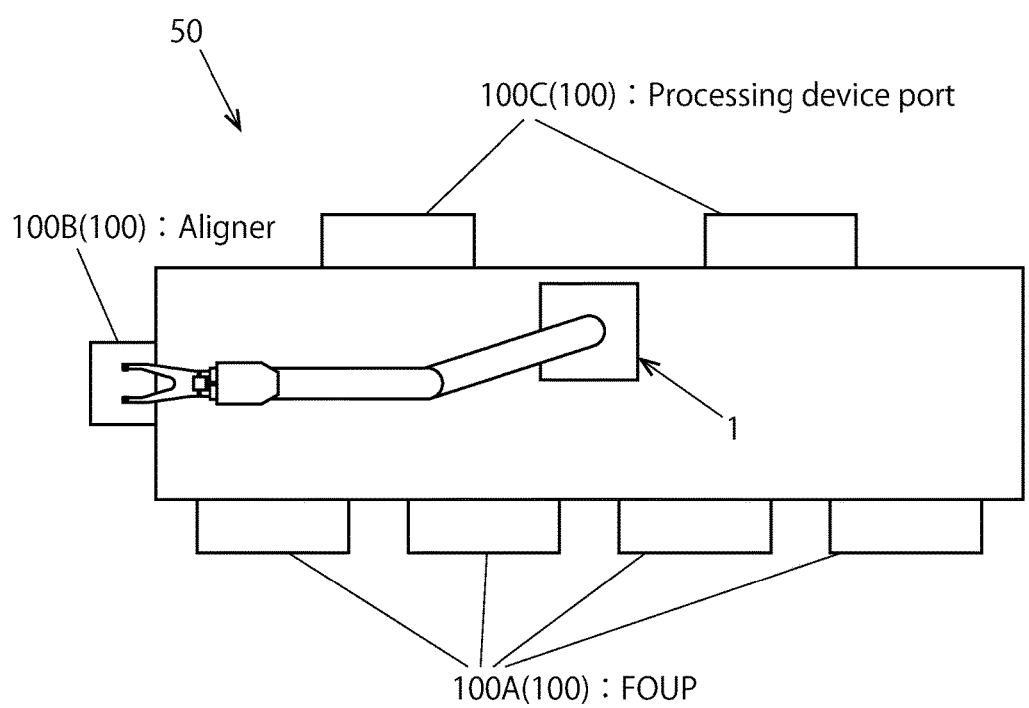
FIG. 26 is a schematic plan view illustrating a substrate processing system provided with the substrate conveying robot illustrated in FIG. 1 and different kinds of substrate placing structures.

Next, a substrate processing system provided with the substrate conveying robot 1 according to the embodiment or each modified example above and a plurality of different kinds of substrate placing structures 100 will be described referring to FIG. 26.

The substrate processing system 50 comprises a FOUP 100A, an aligner 100B, and a processing device port 100C as the substrate placing structures 100. In the embodiment, the substrate placing pitches in these substrate placing structures 100 are set to the same. Here, the aligner 100B has a placing portion (not illustrated) for temporarily placing the substrate S other than a placing portion for rotating the substrate (wafer) S.

Thus, in the embodiment, the substrate placing pitches of a plurality of kinds of substrate placing structures 100 are set to the same. Therefore, the relative moving distance of the upper blade member 25 and the lower blade member 26 in the vertical direction can be minimized.

Note that, although the case when the processed substrate S is received from the upper stage of the substrate placing structure 100 and the unprocessed substrate S is placed on the lower stage of the substrate placing structure 100 is described in the embodiment and each modified example above, on the contrary, the processed substrate may be received from the lower stage of the substrate placing structure 100 and the unprocessed substrate may be placed on the upper stage of the substrate placing structure 100.

In this case, the vertical interval between the upper blade member 25 and the lower blade member 26 is made maximum (full pitch), and the upper blade member 25 in the substrate holding state is advanced above the upper stage of the substrate placing structure 100 and the lower blade member 26 in the substrate non-holding state is advanced below the lower stage of the substrate placing structure 100. Then, the substrate S is placed on the upper stage of the substrate placing structure 100 by the lowering operation of the upper blade member 25 and the substrate S is received from the lower stage of the substrate placing structure 100 by the elevating operation of the lower blade member 26.

Also, when the processed substrate S received from the first substrate placing structure 100 is placed in the second substrate placing structure 100, the processed substrate S may be placed in the second substrate placing structure 100 and the new unprocessed substrate S may be received according to the operation opposite to the substrate receiving operation/substrate placing operation in the first substrate placing structure 100.

For example, when the substrate receiving operation/substrate placing operation is executed by expanding the vertical interval between the upper blade member 25 and the lower blade member 26 in the first substrate placing structure 100, the substrate receiving operation/substrate placing operation may be executed by reducing the vertical interval between the upper blade member 25 and the lower blade member 26 in the second substrate placing structure 100.

Figure 27:
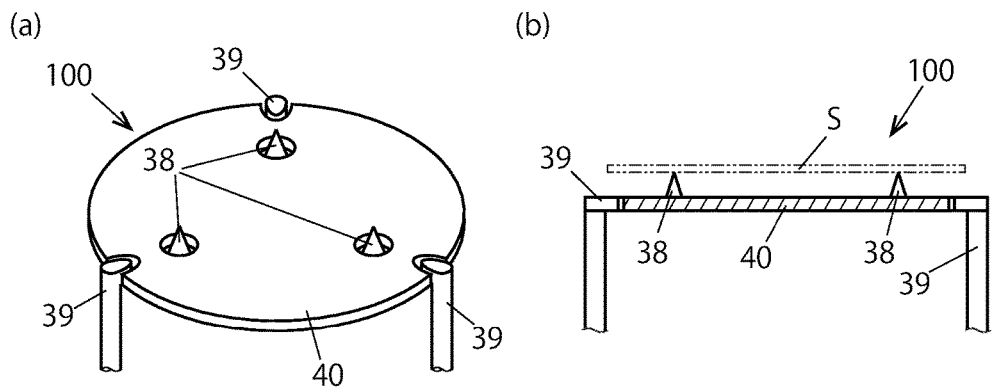
FIG. 27 is a view schematically illustrating an example of the configuration whose processing device stage can be switched into the substrate placing structure consisting of upper and lower stages in the state that the upper stage is lowered, (a) is a perspective view, and (b) is a side view.
Figure 28:
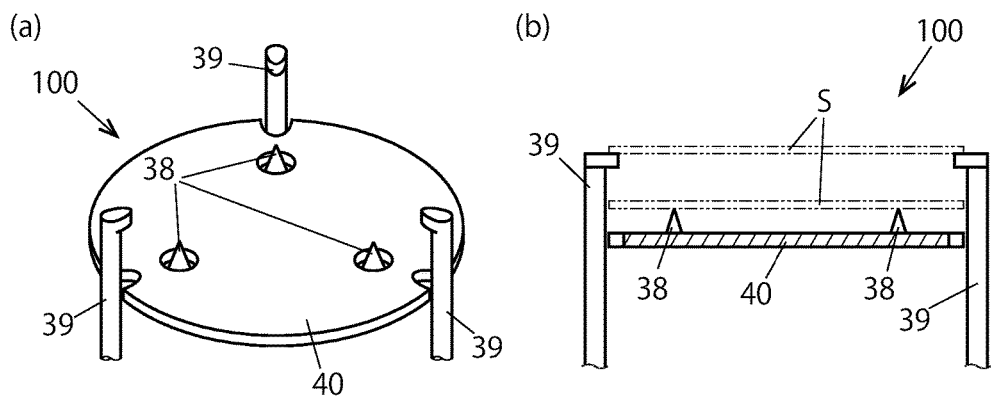
FIG. 28 is a schematic view illustrating the substrate placing structure illustrated in FIG. 27 in the state that the upper stage is elevated, (a) is a perspective view, and (b) is a side view.

FIG. 27 (*a*), (*b*) and FIG. 28 (*a*), (*b*) illustrate an example of the configuration that a stage 40 of the processing device can be switched into the substrate placing structure 100 consisting of upper and lower stages. Although a turntable in the resist application process and a hotplate in the thermal processing step can be employed as a stage, the configuration can be broadly applied to the substrate placing structure which is not consisting of the upper and lower stages, not limiting to them.

The substrate placing structure 100 has three lower stage movable pins 38 configuring the lower stage and three upper stage movable pins 39 configuring the upper stage. The upper stage movable pin 39 can be switched between the state that it retracted to the same height as the substrate placing surface of the stage 40 or lower than the height as illustrated in FIG. 27 (*a*), (*b*) and the state that it is lifted upward as illustrated in FIG. 28 (*a*), (*b*). The lower movable pin 38 can also be retracted to the same height as the substrate placing surface of the stage 40 or lower than the height.

In the state that the lower stage movable pin 38 and the upper stage movable pin 39 are lifted, the substrate S can be placed on each of the lower stage movable pin 38 and the upper stage movable pin 39.

Also, the upper stage movable pin 39 can switch the substrate supporting piece provided on the upper end of the pin between the radially inward direction and the radially outward direction by rotating about its longitudinal axis. Thereby, from the state in FIG. 28 (*a*), the substrate supporting piece provided on the upper end of the upper stage movable pin 39 can be lowered to the retracting position illustrated in FIG. 27 (*a*) while permitting it to avoid the substrate S placed on the stage 40 of the lower stage movable pin 38. On the contrary, the substrate supporting piece provided on the upper end of the upper stage movable pin 39 can be lifted to the state illustrated in FIG. 28 (*a*) while permitting it to avoid the substrate S placed on the lower movable pin 38 from the retracting position illustrated in FIG. 27(*a*).

Figure 29:
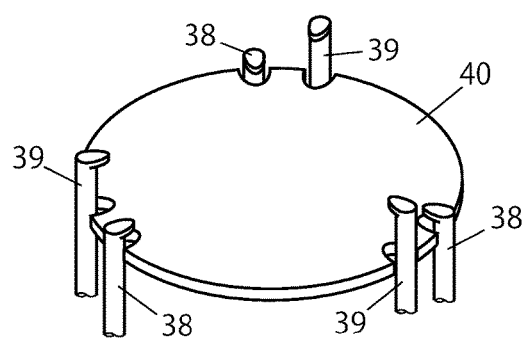
FIG. 29 is a perspective view illustrating another example of the configuration whose processing device stage can be switched into the substrate placing structure consisting of upper and lower stages in the state that the upper stage is elevated.

FIG. 29 illustrates another example of the configuration capable of switching the stage 40 of the processing device into the substrate placing structure 100 consisting of upper and lower stages. In the example, the three lower stage movable pins 38 and the three upper stage movable pins 39 are arranged on the same circumference. Also in the example, the same function as the example illustrated in FIG. 27(*a*), (*b*) and FIG. 28(*a*), (*b*) can be achieved by driving or rotationally driving the upper stage movable pin 39 to be elevated.

Moreover, in the example illustrated in FIG. 27(*a*), (*b*) and FIG. 28(*a*), (*b*), and the example illustrated in FIG. 29, instead of the rotational operations of the movable pins, forward/backward operations in the radial directions may be used for avoiding the substrate.

Figure 30:
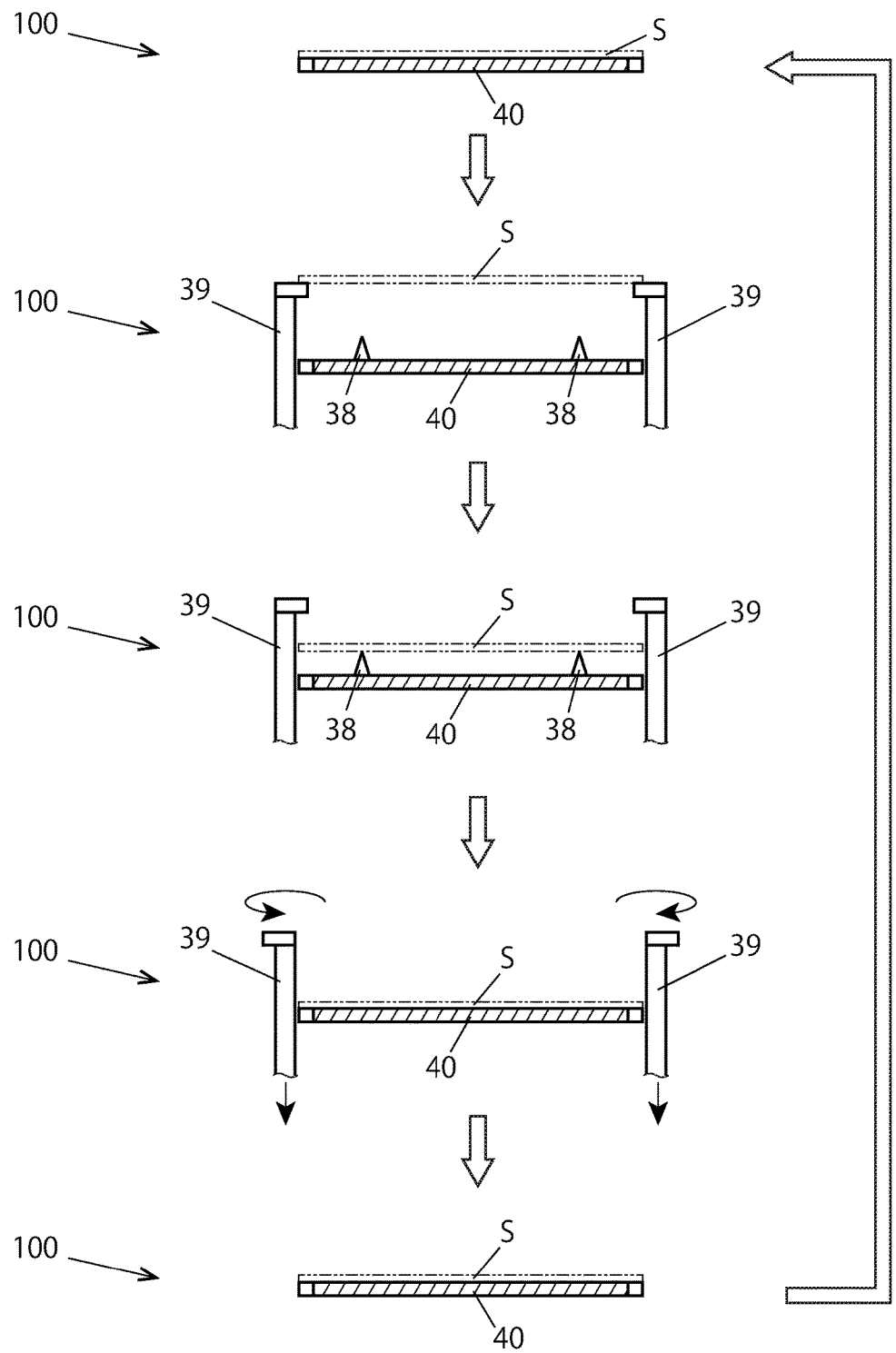
FIG. 30 is a view illustrating an operation when receiving a processed substrate and placing an unprocessed substrate using the substrate conveying robot illustrated in FIG. 1 in the substrate placing structure in FIG. 27 and FIG. 28.

FIG. 30 illustrates an operation when the processed substrate S is received and the unprocessed substrate S is placed using the substrate conveying robot 1 illustrated in FIG. 1 in the substrate placing structure 100 in FIG. 27 and FIG. 28.

Figure 31:
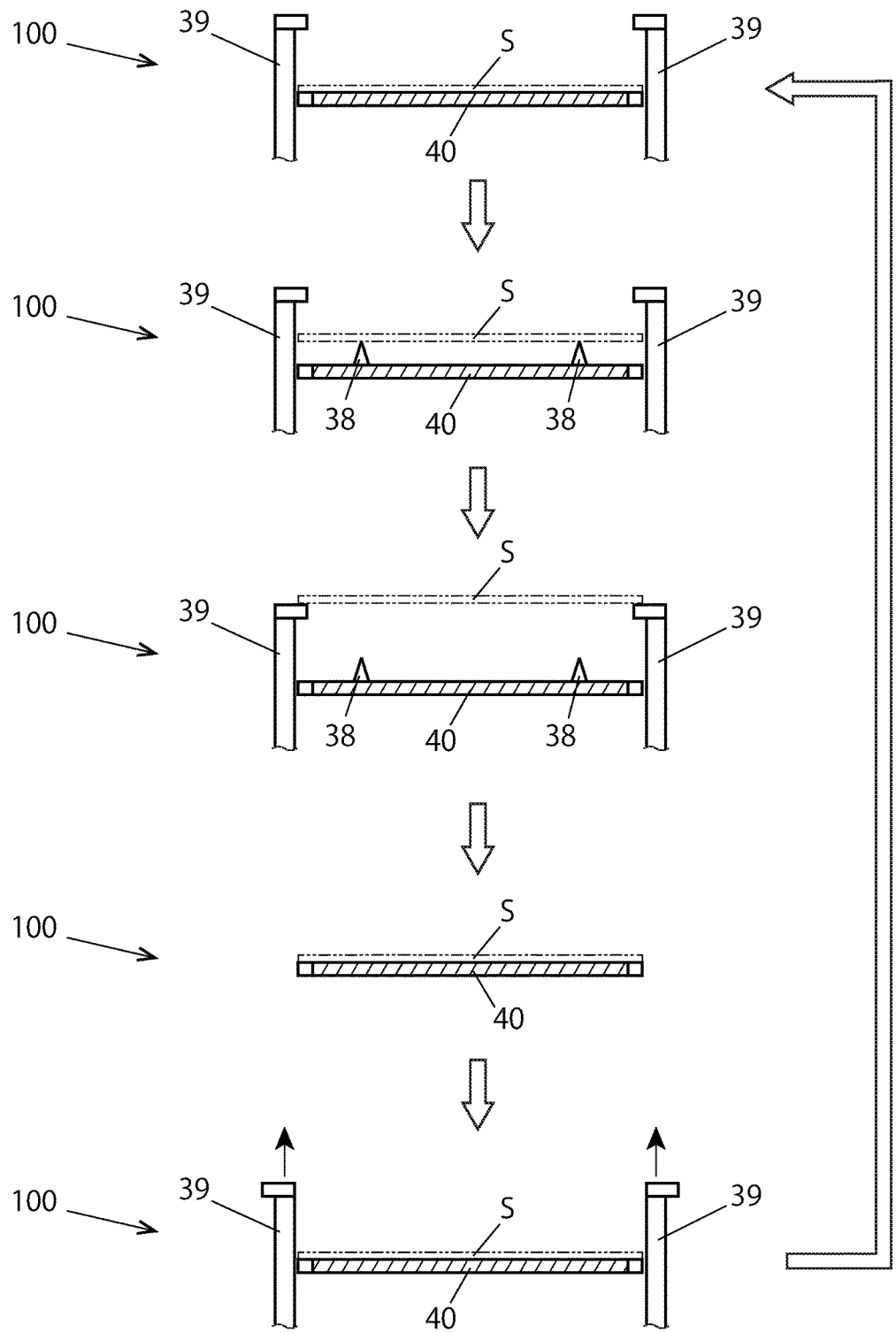
FIG. 31 is a view illustrating an operation when receiving a processed substrate and placing an unprocessed substrate using the substrate conveying robot illustrated in FIG. 1 in the substrate placing structure in FIG. 27 and FIG. 28.

FIG. 31 illustrates another operation when the processed substrate S is received and the unprocessed substrate S is placed using the substrate conveying robot 1 illustrated in FIG. 1 in the substrate placing structure 100 in FIG. 27 and FIG. 28.

As illustrated in FIG. 30 and FIG. 31, the processed substrate S and the unprocessed substrate S can be replaced with each other quickly using the substrate conveying robot 1 by lifting the processed substrates S by the upper movable pin 39 or the lower movable pin 38 thereby putting them in the upper and lower stages.

Note that, when one blade member is vertically driven by an air cylinder or the like and the other blade member is driven by a Z-axis motor, the drive speed of the Z-axis motor may be adjusted based on the operation speed of the air cylinder which has been detected. At this time, some alarm may be generated when the operation speed of the air cylinder is higher/lower than a predetermined value.

DESCRIPTION OF REFERENCE NUMERALS

1 substrate conveying robot
2 base
3 rotary main shaft
4 robot arm
5 first link member
6 second link member
7 substrate holding device
8 Z-axis elevating drive source (Z-axis elevating unit)
9 turning drive source
10 drive source for rotational operation of second link member
11 drive source for rotational operation of substrate holding device
12 robot controller (control unit)
13 upper hand
14 lower hand
15 inner wrist shaft
16 outer wrist shaft
17, 18 wrist shaft drive source
19 upper hand base portion
20 lower hand base portion
21 upper elevating air cylinder
22 lower elevating air cylinder
23 upper elevating member
24 lower elevating member
25 upper blade member
26 lower blade member
27 fixed gripping portion
28 bottom surface supporting portion
29 upper pressing air cylinder
30 lower pressing air cylinder
31 movable gripping portion
32 single hand
33 hand base portion of single hand
34 single elevating air cylinder
35 substrate detection unit
36 substrate sensor
37 sensor amplifier
38 lower stage movable pin
39 upper stage movable pin
40 stage of processing device
50 substrate processing system
100 substrate placing structure
100A FOUP
100B aligner
100C processing device port
S substrate (wafer)

The invention claimed is:

1. A substrate conveying robot for holding and conveying a substrate, comprising:
   a robot arm;
   a substrate holding device mounted on the robot arm; and
   a controller for controlling the robot arm and the substrate holding device,
   wherein the substrate holding device has a pair of blade members which are arranged in a vertical direction and each of which is configured to hold the substrate, a fixed gripping portion which is provided to each of the pair of blade members and is to be abutted on an edge portion of the substrate, a movable gripping portion for gripping the substrate together with the fixed gripping portion by pressing the substrate, and a blade elevating unit for moving one of the pair of blade members relative to an other one of the pair of blade members in a vertical direction, wherein the pair of blade members have a common rotational axis so as to be rotated about the common rotational axis independently with each other, wherein the controller is configured to make the robot arm and the substrate holding device execute, in a state that the one of the pair of blade members is in a substrate holding state and the other one of the pair of blade members is in a substrate non-holding state, a blade member advancing operation for advancing the pair of blade members into a substrate placing structure having an upper stage and a lower stage, a substrate receiving operation for receiving the substrate placed on one of the upper stage and the lower stage by the blade member in the substrate non-holding state, and a substrate placing operation for placing the substrate on the blade member in the substrate holding state onto an other one of the upper stage and the lower stage wherein a timing of receiving the substrate by the substrate receiving operation is shifted from a timing of placing the substrate by the substrate placing operation, and wherein an inner wrist shaft within an outer wrist shaft of a pair of hands of the substrate holding device are arranged in a vertical direction and are coaxial with the common rotational axis.

2. The substrate conveying robot according to claim 1, wherein the controller is configured to control the robot arm and the substrate holding device so that, in the substrate receiving operation, the blade member is advanced until the fixed gripping portion of the blade member exceeds a position of an edge portion on a distal side of the substrate placed on the substrate placing structure, and after that, the blade member in the substrate non-holding state is elevated so as to receive the substrate by the blade member.

3. The substrate conveying robot according to claim 1, wherein a pair of the movable gripping portions is configured to be driven independently from each other.

4. The substrate conveying robot according to claim 1, further comprising a Z-axis elevating unit having a servo motor capable of elevating the pair of blade members simultaneously, wherein the substrate receiving operation is executed using the Z-axis elevating unit.

5. The substrate conveying robot according to claim 1, wherein the substrate receiving operation is executed by an upper blade member of the pair of blade members.

6. The substrate conveying robot according to claim 1, wherein the substrate holding device is configured to be switchable between a first working state that the pair of the blade members are arranged in a vertical direction and a second working state that the pair of blade members are arranged in positions deviating from a vertical direction and a single one of the pair of blade members is configured to advance into the substrate placing structure.

7. The substrate conveying robot according to claim 1, wherein the controller is configured to elevate the blade member on a lower side by the blade elevating unit prior to the substrate receiving operation and the substrate placing operation in a state that both the pair of blade members are in the substrate non-holding state so as to make the robot arm and the substrate holding device execute a lowermost stage substrate receiving operation for receiving the substrate placed on a lowermost stage of the substrate placing structure.

8. The substrate conveying robot according to claim 1, wherein both the pair of blade members are driven to be elevated by the blade elevating unit.

9. The substrate conveying robot according to claim 8, wherein the blade elevating unit is configured to drive each of the pair of blade members to be elevated independently.

10. The substrate conveying robot according to claim 8, wherein the blade elevating unit has a pair of fluid pressure cylinders for respectively driving the pair of blade members to be elevated, wherein the fluid pressure cylinder for the blade member on an upper side is arranged such that its piston faces downward, and wherein the fluid pressure cylinder for the blade member on a lower side is arranged such that its piston faces upward.

11. The substrate conveying robot according to claim 1, wherein only one of the pair of blade members is driven to be elevated by the blade elevating unit.

12. The substrate conveying robot according to claim 11,
wherein the blade elevating unit has a fluid pressure cylinder for driving one of the pair of blade members to be elevated, and wherein an other one of the pair of blade members is positioned on a side opposite to a side where a piston of the fluid pressure cylinder is positioned.

13. The substrate conveying robot according to claim 11, further comprising a substrate detection unit having a substrate sensor provided on a distal end portion of the blade member which is not driven to be elevated by the blade elevating unit.

14. The substrate conveying robot according to claim 1, further comprising a substrate detection unit having a substrate sensor provided on a distal end portion of the blade member which is driven to be elevated by the blade elevating unit.

15. The substrate conveying robot according to claim 1,
wherein the substrate holding device has the pair of hands arranged in a vertical direction, each of the pair of hands having the blade member, and wherein each of the pair of hands has a plurality of the blade members whose vertical intervals are fixed mutually.

16. A substrate processing system, comprising:
the substrate conveying robot according to claim 1; and
a plurality of different kinds of the substrate placing structures, wherein a substrate placing pitch in a plurality of the substrate placing structures is the same.

* * * * *